(12) United States Patent
Yamaoka et al.

(10) Patent No.: US 6,809,975 B2
(45) Date of Patent: Oct. 26, 2004

(54) SEMICONDUCTOR MEMORY DEVICE HAVING TEST MODE AND MEMORY SYSTEM USING THE SAME

(75) Inventors: Shigeru Yamaoka, Hyogo (JP); Shigehiro Kuge, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/274,892

(22) Filed: Oct. 22, 2002

(65) Prior Publication Data

US 2003/0202409 A1 Oct. 30, 2003

(30) Foreign Application Priority Data

Apr. 26, 2002 (JP) ........................................ 2002-126866

(51) Int. Cl.[7] ................................................ G11C 7/00
(52) U.S. Cl. ...................................... 365/201; 365/233
(58) Field of Search ................................ 365/201, 233

(56) References Cited

U.S. PATENT DOCUMENTS 5,121,007 A * 6/1992 Aizaki ........................ 327/544
6,400,625 B2 * 6/2002 Arimoto et al. ............. 365/201
6,614,713 B2 * 9/2003 Tanizaki et al. ............. 365/233
6,615,391 B2 * 9/2003 Brown et al. ................... 716/4

FOREIGN PATENT DOCUMENTS

JP    11-312398    11/1999

* cited by examiner

Primary Examiner—M. Tran
(74) Attorney, Agent, or Firm—McDermott Will & Emery LLP

(57) ABSTRACT

This DDR SDRAM includes a test mode entry signal generation circuit which sets a test mode entry signal at "H" level in accordance with a consecutive input of a first command, a second command, a test mode entry set command, a third command and a test mode register set command synchronously with a rising edge of a clock signal. This enables the DDR SDRAM to enter a test mode without using a high voltage. The DDR SDRAM can, therefore, enter the test mode even if it is incorporated into a registered DIMM.

9 Claims, 37 Drawing Sheets

FIG.2

| COMMAND | MNEMONIC | CKE N-1 | CKE N | /CS | /RAS | /CAS | /WE | BA0,1 | A10 /AP | A0-9, 11,12 |
|---|---|---|---|---|---|---|---|---|---|---|
| DESELECT | DESEL | H | H | H | X | X | X | X | X | X |
| NO OPERATION | NOP | H | H | L | H | H | H | X | X | X |
| ROW ADDRESS ENTRY AND BANK ACTIVATE | ACT | H | H | L | L | H | H | V | V | V |
| SINGLE BANK PRECHARGE | PRE | H | H | L | L | H | L | V | L | X |
| ALL BANK PRECHARGE | PREA | H | H | L | L | H | L | X | H | X |
| ROW ADDRESS ENTRY AND WRITE | WRITE | H | H | L | H | L | L | V | L | V |
| ROW ADDRESS ENTRY AND WRITE WITH AUTO-PRECHARGE | WRITEA | H | H | L | H | L | L | V | H | V |
| ROW ADDRESS ENTRY AND READ | READ | H | H | L | H | L | H | V | L | V |
| ROW ADDRESS ENTRY AND READ WITH AUTO-PRECHARGE | READA | H | H | L | H | L | H | V | H | V |
| AUTO-REFRESH | REFA | H | H | L | L | L | H | X | X | X |
| SELF-REFRESH ENTRY | REFS | H | L | L | L | L | H | X | X | X |
| SELF-REFRESH EXIT | REFSX | L | H | H | X | X | X | X | X | X |
|  |  | L | H | L | H | H | H | X | X | X |
| BURST TERMINATE | TERM | H | H | L | H | H | L | X | X | X |
| MODE REGISTER SET | MRS | H | H | L | L | L | L | L | L | V |

H = "H" LEVEL, L = "L" LEVEL, V = VALID, X = ARBITRARY, N = NUMBER OF CLOCK CYCLES

SEMICONDUCTOR MEMORY DEVICE HAVING TEST MODE AND MEMORY SYSTEM USING THE SAME

BACKGROUND OF THE INVENTION

1. Field of the Invention

The present invention relates to a semiconductor memory device and a memory system using the same, and more particularly to a semiconductor memory device taking in a plurality of external signals synchronization with a clock signal and a memory system using the same.

2. Description of the Background Art

A semiconductor memory device such as a DRAM, an SDRAM (Synchronous DRAM) or a DDR (Double Date Rate) DRAM conventionally has a test mode for improving the efficiency of a product test performed by a vender and facilitating the product test.

FIG. 43 is a block diagram showing the important sections of such a DDR SDRAM. In FIG. 43, DDR SDRAM includes a test mode entry circuit 301 and a decoding circuit 302. A test mode entry set command TMES and a high voltage SVIH (Super VIH) sufficiently higher than an external power supply voltage VCC are applied to predetermined external pins (e.g., bank select BA1 pins), test mode entry circuit 301 sets test mode entry signal TMODE at active level of "H" level.

In response to the setting of test mode entry signal TMODE at "H" level, decoding circuit 302 is activated and a test mode register set command TMRS is applied thereto. In addition, in response to the application of test mode set data TMSD (address signals A0 to A6), decoding circuit 302 selects one test mode signal (e.g., TMx) from among (x+1) (where x is an integer not smaller than 0) test mode signals TM0 to TMx based on test mode set data TMSD and sets selected signal TMx at active level of "H" level. As a result, SDRAM is set in a test mode corresponding to test mode signal TMx which is set at "H" level.

The reason for allowing DDR SDRAM to enter the test mode using high voltage SVIH sufficiently higher than external power supply voltage VCC is to prevent DDR SDRAM from entering the test mode by an ordinary user.

The test mode entry method using high voltage SVIH has, however, the following disadvantage. While a single device can enter a test mode, a module such as a registered DIMM (Dual In Memory Module) into which a plurality of devices are incorporated cannot enter a test mode.

That is, as shown in FIG. 44, registered DIMM includes one register 303 and a plurality of DDR SDRAM 304. An external control signal CNT and an external address signal ADD are inputted into a plurality of DDR SDRAM 304 in parallel through register 303. Due to this, even if high voltage SVIH is applied to an external pin for a bank select signal BA0 which is included in address signal ADD, the presence of register 303 prevents high voltage SVIH from being applied to SDRAM 304, with the result that registered DIMM cannot enter a test mode.

SUMMARY OF THE INVENTION

It is, therefore, a main object of the present invention to provide a semiconductor memory device capable of entering a test mode even if an external signal is inputted thereinto through a register, and a memory system using the same.

A semiconductor memory device according to the present invention includes a decoder which outputs one command signal among a plurality of command signals based on a combination of the logic levels of a plurality of external signals taken in, and a first signal generation circuit which outputs a test mode entry signal for enabling the semiconductor memory device to enter a test mode in accordance with the output of the plurality of command signals from the decoder in a predetermined order. This enables the semiconductor memory device to enter the test mode without using a high voltage. Therefore, the semiconductor memory device can enter the test mode even if the external signals are applied through a register. Further, since the semiconductor memory device enters the test mode only if the plurality of command signals are inputted in a predetermined order, the probability that the semiconductor memory device enters the test mode while an ordinary user is using the semiconductor memory device is low.

In addition, a memory system according to the present invention includes a plurality of the above-described semiconductor memory devices. Signals other than external data signals among the plurality of external signals are applied to the plurality of semiconductor memory devices in common and the external data signals are individually applied to the respective semiconductor memory devices. In this case, it is possible to make the operation timings of the plurality of semiconductor memory devices consistent with one another.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view showing the relationship between combinations of logic levels of external signals shown in FIG. 1 and commands;

DESCRIPTION OF THE PREFERRED EMBODIMENTS

First Embodiment

Figure 1:
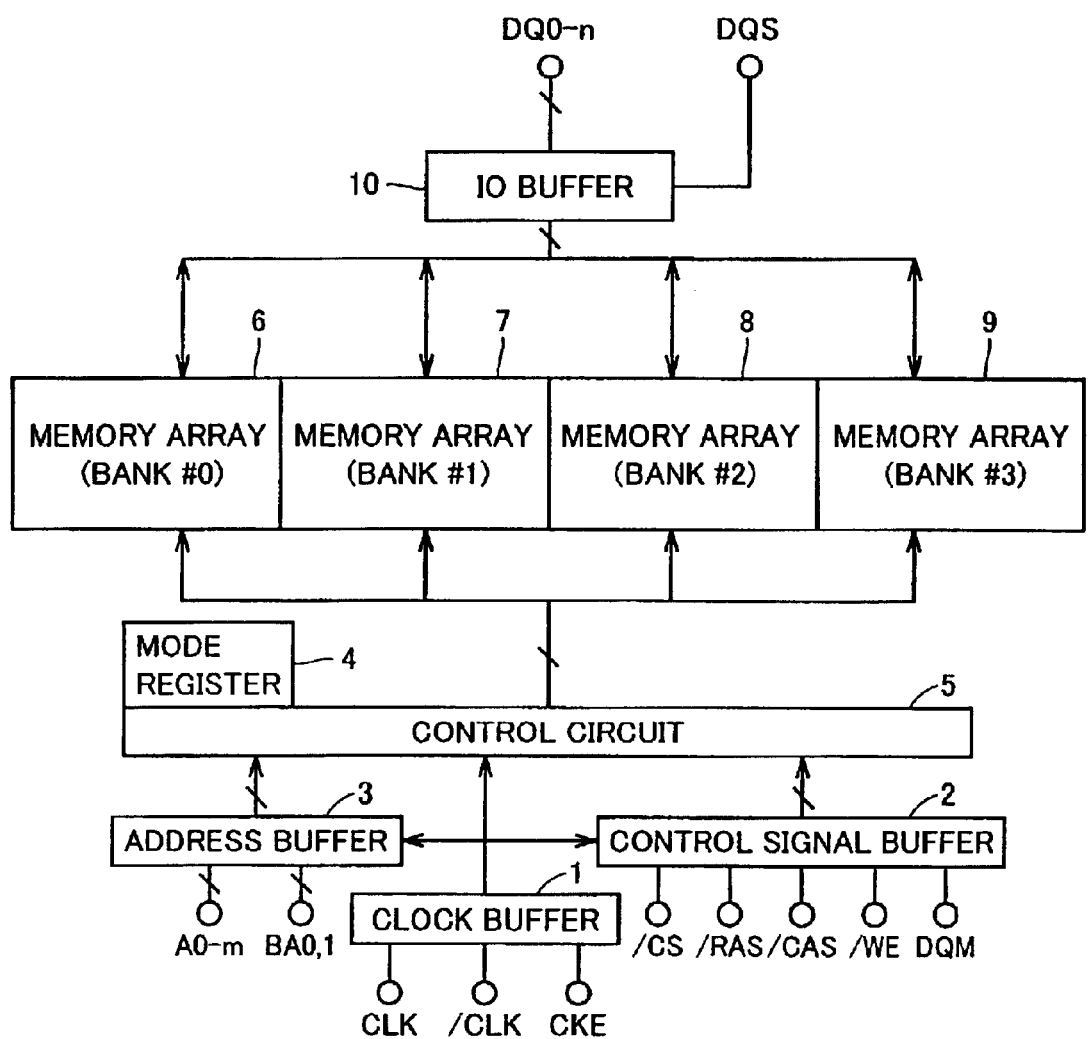
FIG. 1 is a block diagram showing the overall configuration of DDR SDRAM according to the first embodiment of the present invention.

FIG. 1 is a block diagram showing the overall configuration of a DDR SDRAM according to the first embodiment of the present invention. In FIG. 1, this DDR SDRAM includes a clock buffer 1, a control signal buffer 2, an address buffer 3, a mode register 4, a control circuit 5, four memory arrays 6 to 9 (banks #0 to #3) and an IO buffer 10.

Clock buffer 1 is activated by an external control signal CKE and transmits external clocks CLK and /CLK to control signal buffer 2, address buffer 3 and control circuit 5. Control signal buffer 2 latches external control signals ICS, /RAS, /CAS, /WE and DQM synchronously with external clock signals CLK and /CLK from clock buffer 1 and applies the latched external control signals to control circuit 5. Address buffer 3 latches external address signals A0 to Am (where m is an integer not smaller than 0) and bank select signals BA0 and BA1 synchronously with external clock signals CLK and /CLK from clock buffer 1 and applies the latched signals to control circuit 5.

Mode register 4 stores modes instructed by external address signals A0 to Am and the like and outputs internal command signals according to the respective modes. Memory cell arrays 6 to 9 are arranged in rows and columns and each of memory cell arrays 6 to 9 includes a plurality of memory cells each of which stores data of one bit. A plurality of memory cells are grouped for (n+1) memory cells (where n is an integer not smaller than 0), respectively.

Control circuit 5 generates various internal signals in accordance with the signals from clock buffer 1, control signal buffer 2, address buffer 3 and mode register 4 and thereby controls the entirety of SDRAM. In a write operation and a read operation, control circuit 5 selects one of four memory arrays 6 to 9 in accordance with bank select signals BA0 and BA1 and selects (n+1) memory cells in the selected memory array in accordance with address signals A0 to Am. The selected (n+1) memory cells are activated and connected to IO buffer 10.

IO buffer 10 applies data signals D0 to Dn which are inputted synchronously with an external data strobe signal DQS to the selected (n+1) memory cells in the write operation, and outputs read data signals Q0 to Qn of the (n+1) memory cells together with data strobe signal DQS to the outside of DDR SDRAM.

Figure 3:
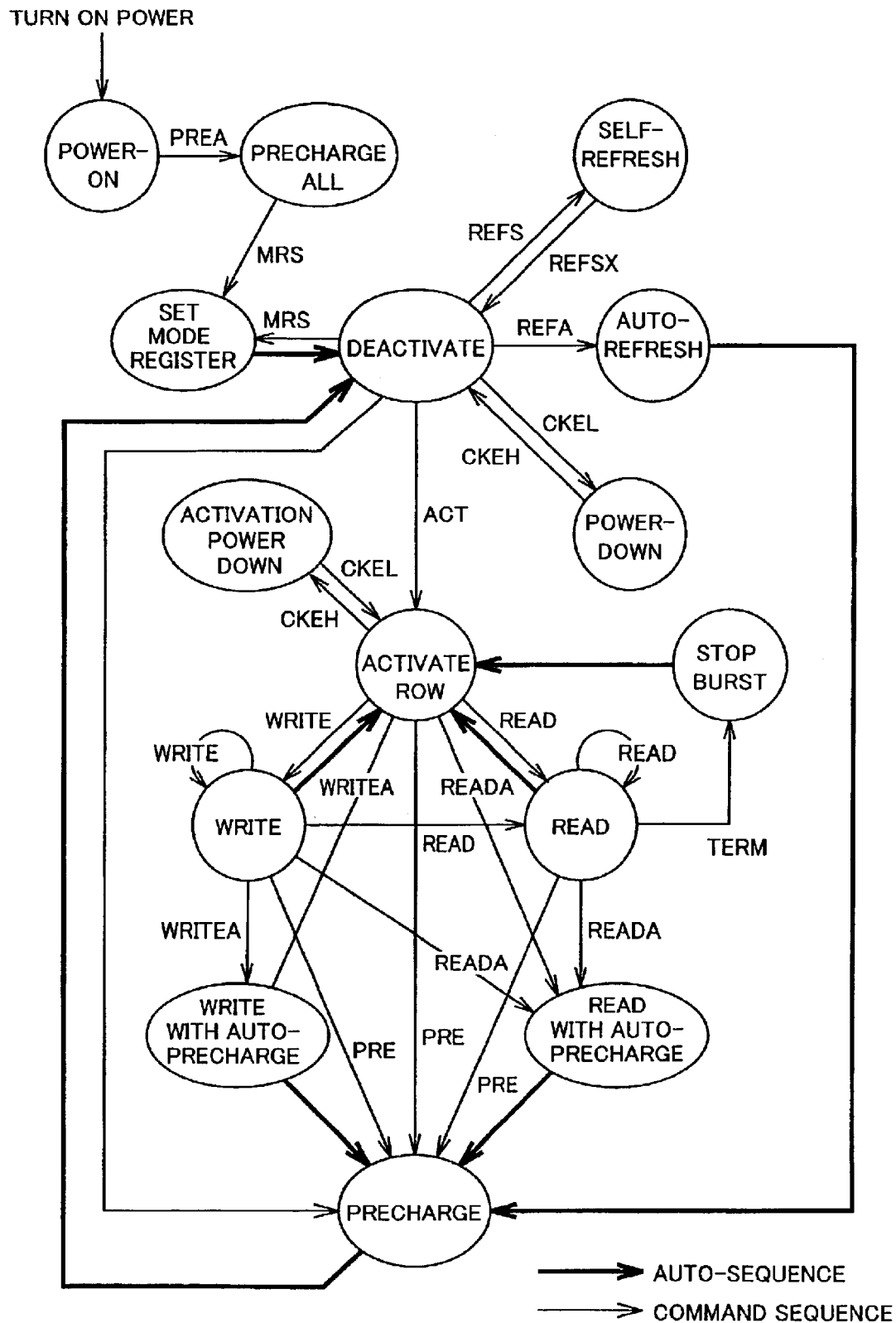
FIG. 3 is a state transition diagram of DDR SDRAM shown in FIG. 1.

The operation of this DDR SDRAM will next be described. FIG. 2 is a command truth table and FIG. 3 is a state transition diagram. In FIG. 2, various commands can be applied to this DDR SDRAM, depending on combinations of logic levels of control signals /RAS, /CAS, /WE, . . . , bank select signals BA0 and BA1 and address signals A0 to Am. In addition, as shown in FIG. 3, DDR SDRAM is changed from a certain state (mode) to another state (mode) in response to an applied command. For example, if an active command ACT is applied in an inactive state, DDR SDRAM turns into a row active state. If a read command READ is applied in the row active state, DDR SDRAM turns into a read state. If a write command WRITE is applied, DDR SDRAM turns into a write state.

It is noted that the command truth table shown in FIG. 2 and the state transition diagram shown in FIG. 3 are those for a user and that a test mode entry set command for a vender to be described later is not shown in FIGS. 2 and 3.

Figure 4:
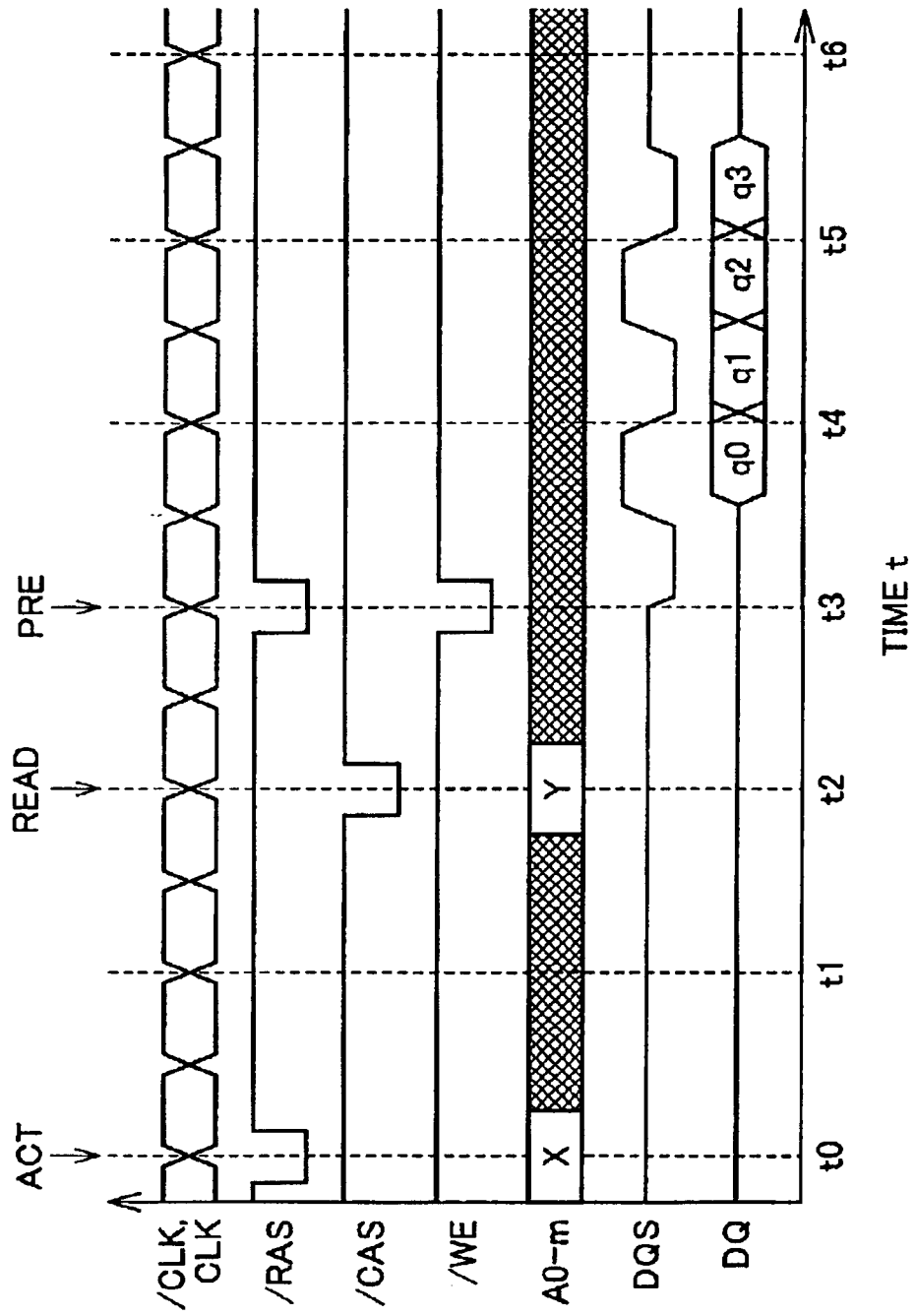
FIG. 4 is a time chart showing the read operation of DDR SDRAM shown in FIG. 1.

FIG. 4 is a time chart showing the read operation of DDR SDRAM. In FIG. 4, an operation for consecutively reading data signals of four bits (per data input/output terminal) is shown. The number of bits of the data signals is referred to as a burst length and can be changed by mode register 4.

SDRAM incorporates external control signals /RAS, /CAS, . . . , address signals A0 to Am and the like at the rising edge of clock signal CLK. Address signals A0 to Am include time-division-multiplexed row address signals X=RA0 to RAm and column address signals Y=CA0 to CAm. At the rising edge of clock signal CLK at time t0, active command ACT (/RAS=L, /CAS=H and /WE=H) is inputted into SDRAM and address signals A0 to Am at that time are incorporated by SDRAM as a row address signal X.

Next, at the rising edge of clock signal CLK at time t2, read command READ (/RAS=H, /CAS=L, /WE=H) is applied to SDRAM and address signals A0 to Am at that time are incorporated by SDRAM as a column address signal Y. In accordance with incorporated row address signal X and column address signal Y, SDRAM executes a row select operation and a column select operation. After predetermined clock cycles (3.5 clock cycles in FIG. 4) pass since the level of signal /RAS falls to "L" level, a first read data signal q0 is outputted. Following this, data signals q1 to q3 are sequentially outputted in response to the cross points between clock signals CKL and /CLK. To enable acceleration of data transfer, data strobe signal DQS is outputted at the same phase as those of output data signals q0 to q3. The rewriting of data to memory cells (precharge of the memory cells) is carried out in response to precharge command PRE (/RAS =L, /CAS=H and /WE=L) at time t3.

Figure 5:
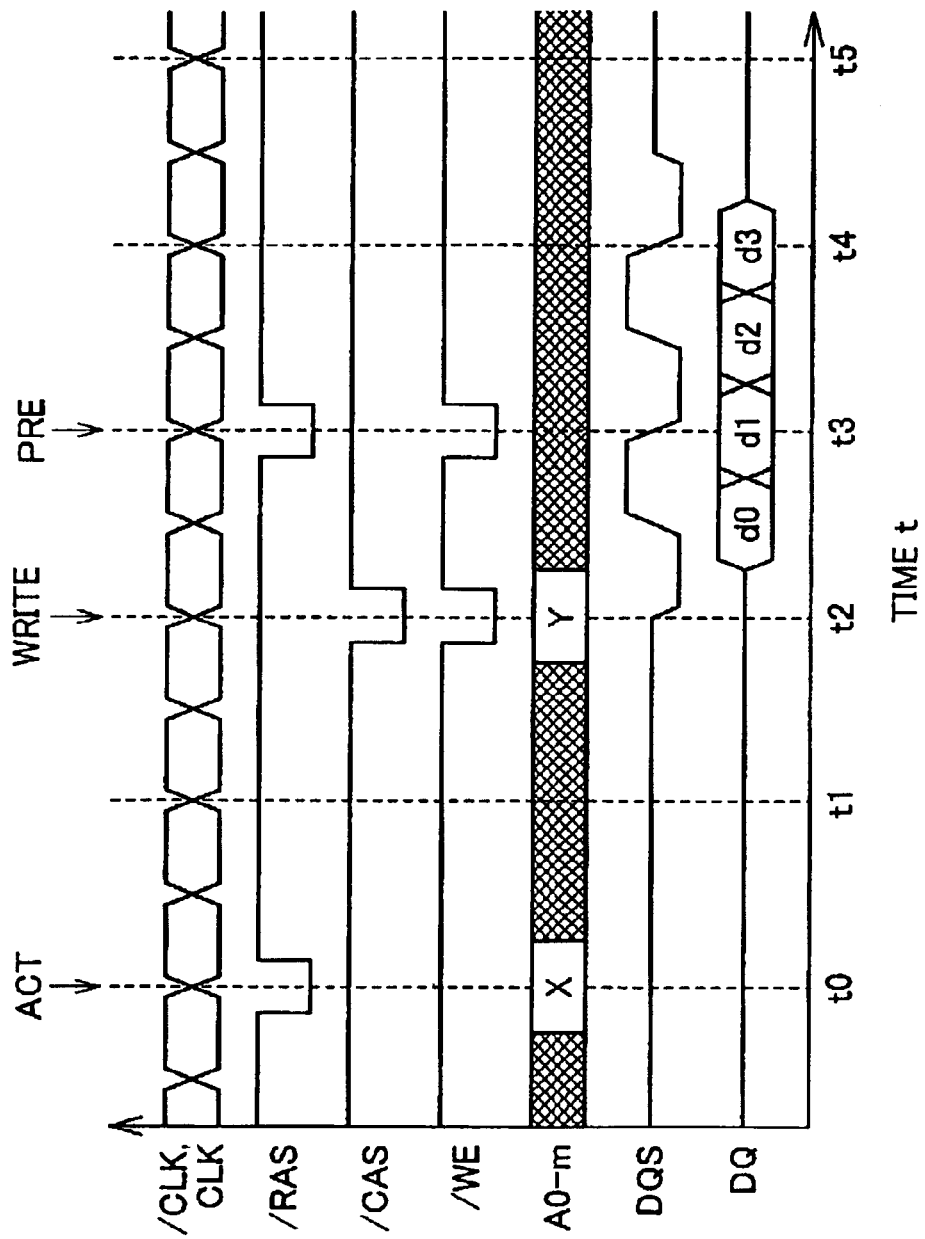
FIG. 5 is a time chart showing the write operation of DDR SDRAM shown in FIG. 1.

FIG. 5 is a time chart showing the write operation of DDR SDRAM. In a write operation, row address signal X is incorporated in the same manner as that of the read operation. Namely, at the rising edge of clock signal CKL at certain time t0, active command ACT (/RAS=L, /CAS=H and /WE=H) is inputted and address signals A0 to Am at that time are incorporated as row address signal X. Next, at the rising edge of clock signal CLK at time t2, write command WRITE (/RAS=H, /CAS=L and /WE=L) is inputted, column address signal Y is incorporated and a data signal d0 applied at that time is incorporated as the first write data signal. In response to this write command WRITE, a row select operation and a column select operation are executed in SDRAM. Write data signals d1 to d3 are sequentially incorporated synchronously with data strobe signal DQS and sequentially written to memory cells. The rewriting of data signals to memory cells (precharging the memory cells) is carried out in response to precharge command (/RAS=L, /CAS=H and /WE=L) at time t3.

Figure 6:
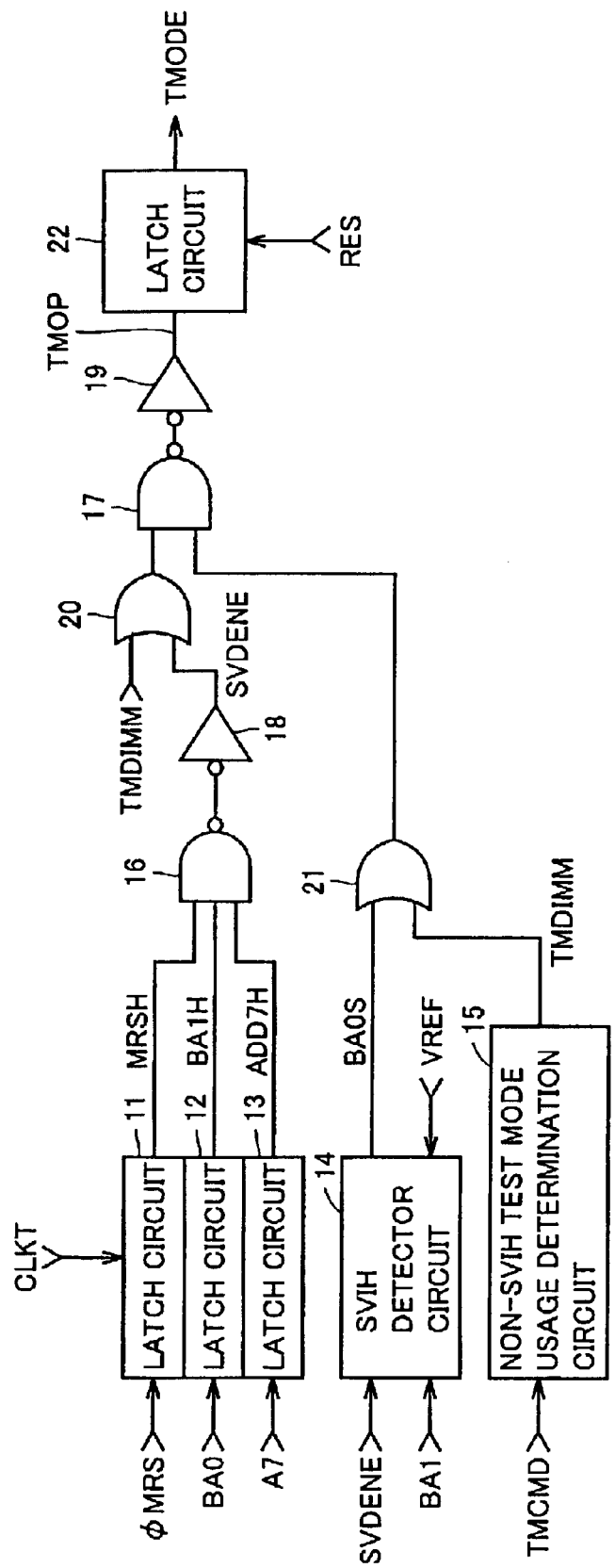
FIG. 6 is a circuit block diagram showing the configuration of a test mode entry signal generation circuit included in DDR SDRAM shown in FIG. 1.

A test mode setting method, which is characteristic of this DDR SDRAM, will now be described. FIG. 6 is a circuit block diagram showing the configuration of the test mode entry signal generation circuit of DDR SDRAM. This DDR SDRAM can make both a test mode entry using high voltage SVIH and a test mode entry without using high voltage SVIH. In FIG. 6, this test mode entry signal generation circuit includes latch circuits 11 to 13, an SVIH detector circuit 14, a NON-SVIH test mode usage determination circuit 15, NAND gates 16 and 17, inverters 18 and 19, OR gates 20 and 21 and a latch circuit 22.

Latch circuits 11 to 13 incorporate the levels of a mode register set signal φMRS, a bank select signal BA0 and address signal A0 and hold the levels of the incorporated signals for one clock cycle, respectively.

Figure 7:
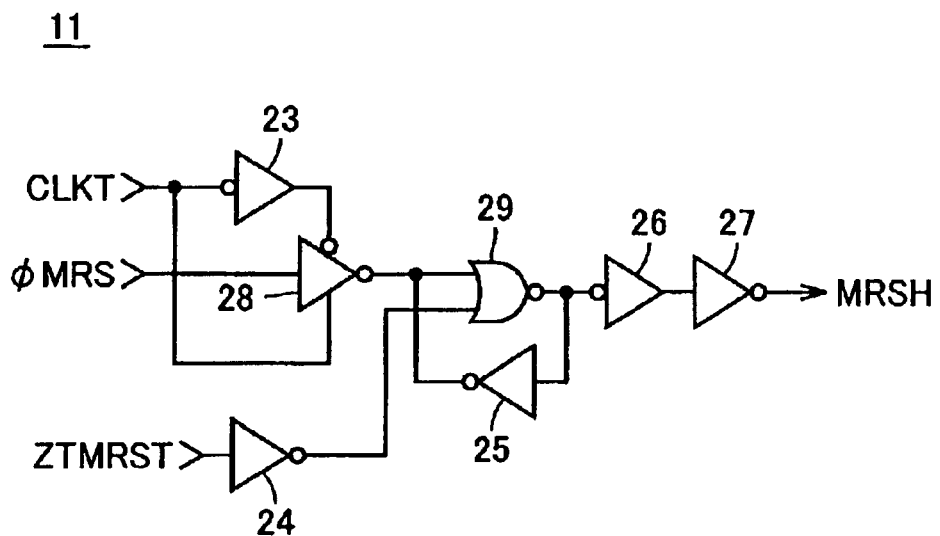
FIG. 7 is a circuit diagram showing the configuration of a latch circuit 11 shown in FIG. 6.

That is, latch circuit 11 includes inverters 23 to 27, a clocked inverter 28 and a NOR gate 29 as shown in FIG. 7. Signal φMRS is inputted into one of the input nodes of NOR gate 29 through inverter 23. A signal ZTMRST is inputted into the other input node of NOR gate 29 through inverter 24. Inverter 25 is connected between the output node and one input node of NOR gate 29. The output signal of NOR gate 29 is delayed by inverters 26 and 27 to become the output signal MRSH of latch circuit 11.

Figure 8:
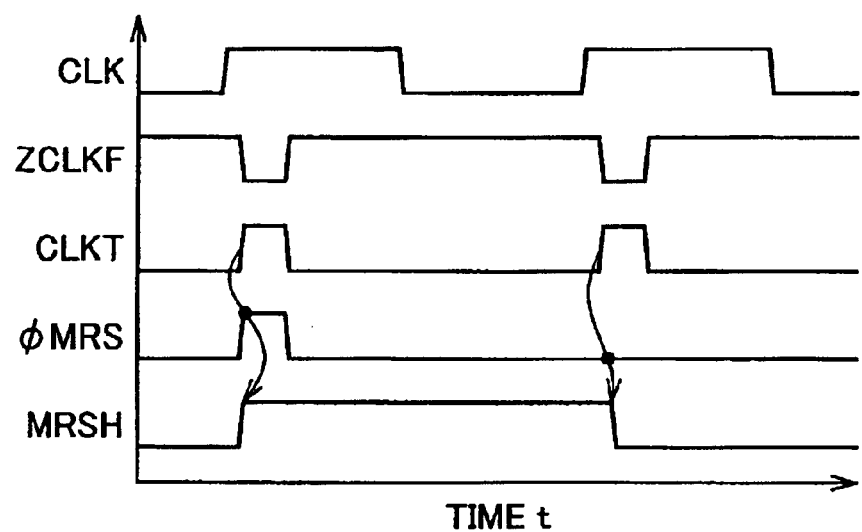
FIG. 8 is a time chart showing the operation of the latch circuit shown in FIG. 7.

As shown in FIG. 8, a signal CLKT is an inversion signal of signal ZCLKF which is set at "L" level for predetermined time in response to the rising edge of clock signal CLK. Signal φMRS is a signal which is set at "H" level in response to mode register set command MRS (/RAS=L, /CAS=L and /WE=L). A signal ZTMRST is a signal which is normally set at "H" level and set at "L" level when being reset.

In an initial state, signal MRSH is reset to "L" level and signal ZTMRST is set at "H" level. While signal CLKT is at "H" level, clocked inverter 28 is activated and signal φMRS is delayed by clocked inverter 28, NOR gate 29 and inverters 26 and 27 to become signal MRSH. If the level of signal CLKL falls from "H" level to "L" level, clocked inverter 28 is deactivated and the level of signal MRSH is held by NOR gate 29 and inverters 25 to 27 and outputted. As shown in FIG. 8, therefore, if signal φMRS is set at "H" level synchronously with signal CLKT, signal MRSH is kept at "H" level for one clock cycle. Latch circuits 12 and 13 are the same in configuration as latch circuit 11.

The output signals MRSH, BA1H and ADD7H of latch circuits 11 to 13 are inputted into NAND gate 16, and the output signal of NAND gate 16 is inverted by inverter 18 to become a signal SVDENE. OR gate 20 receives signal SVDENE and the output signal TMDIMM of NON-SVIH test mode usage determination circuit 15 and the output signal of OR gate 20 is inputted into one of the input nodes of NAND gate 17.

SVIH detector circuit 14, which is activated while signal SVDENE is at "H" level, detects whether the level of bank select signal BA1 exceeds that of high voltage SVIH based on a reference potential VREF and outputs a signal BA0S at level according to the detection result. If signal BA1 is higher in level than SVIH, the level of signal BA0S becomes "H" level. If signal BA1 is lower in level than SVIH, the level of signal BA0S becomes "L" level.

NON-SVIH test mode usage determination circuit 15 sets signal TMDIMM at "H" level in response to the input of a test mode setting command TMCMD including a plurality of commands which are consecutively inputted. NON-SVIH test mode usage determination circuit 15 will be described later in detail. Signal TMDIMM is inputted into the other input node of OR gate 21. The output signal of NAND gate 17 is inverted by inverter 19 to become a signal TMOP. Signal TMOP is applied to latch circuit 22.

Figure 9:
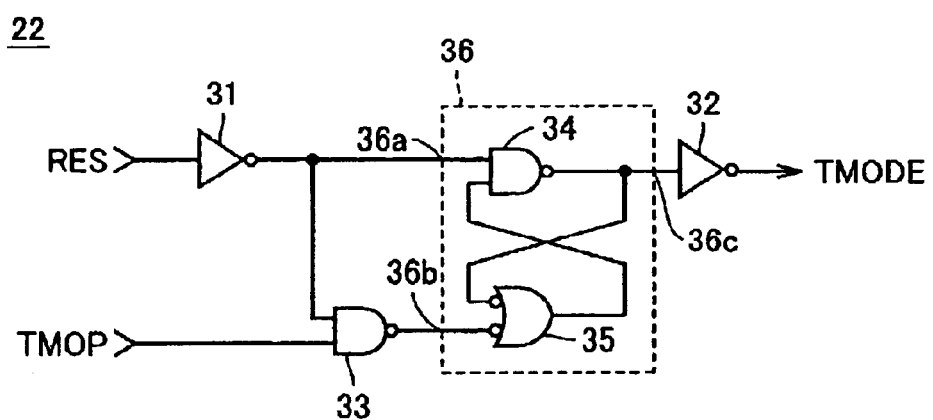
FIG. 9 is a circuit diagram showing the configuration of a latch circuit 22 shown in FIG. 6.

As shown in FIG. 9, latch circuit 22 includes inverters 31 and 32 and NAND gates 33 to 35. NAND gates 34 and 35 constitute a flip-flop 36. A reset signal RES is inputted into one of the input nodes of NAND gate 32 and the reset terminal 36a of flip-flop 36 through inverter 31. Output signal TMOP of inverter 19 is inputted into the other input node of NAND gate 33 and the output signal of NAND gate 33 is inputted into the set terminal 36b of flip-flop 36. A signal which appears at the inversion output terminal 36c of flip-flop 36 is inverted by inverter 31 and becomes a test mode entry signal TMODE.

If reset signal RES is set at "H" level, flip-flop 36 is reset to thereby reset signal TMODE at "L" level. Normally, reset signal RES is set at "L" level. If the level of signal TMOP is raised to "H" level, flip-flop 36 is set to thereby set signal TMODE at "H" level.

Figure 10:
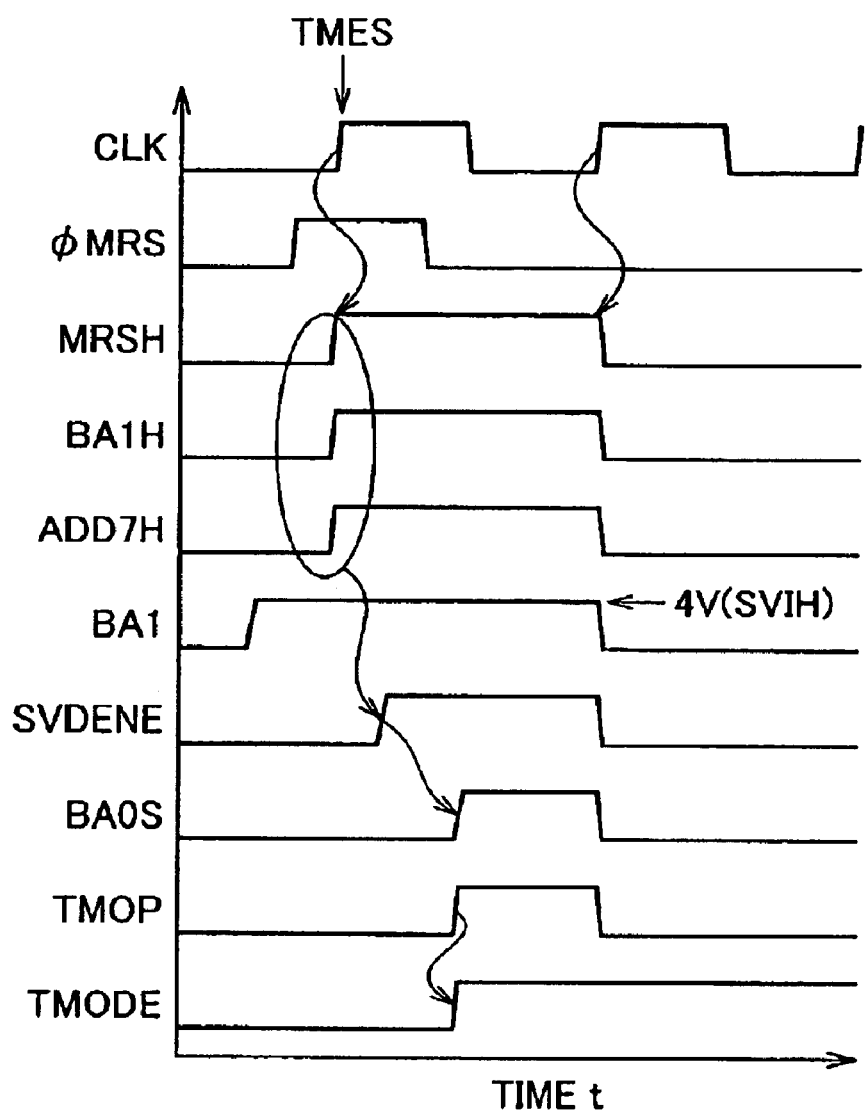
FIG. 10 is a time chart showing the operation of the test mode entry signal generation circuit shown in FIG. 6.

FIG. 10 is a time chart showing a test mode entry method using high signal SVIH. In FIG. 10, at the rising edge of clock signal CLK, a test mode entry set command TMES (/RAS=L, /CAS=L, /WE=L, A7=H and BA0=H) is inputted and bank select signal BA1 is set at high potential SVIH. By doing so, signals MRSH, BAIH and ADD7H are set at "H" level for one clock cycle, signal SVDENE is set at "H" level to activate SVIH detector signal 14, and the level of output signal BAOS of SVIH detector circuit 14 is raised to "H" level. Since signals SVDENE and BA0S are both set at "H" level, the level of signal TMOP is raised to "H" level and that of test mode entry signal TMODE is raised to "H" level.

Figure 11:
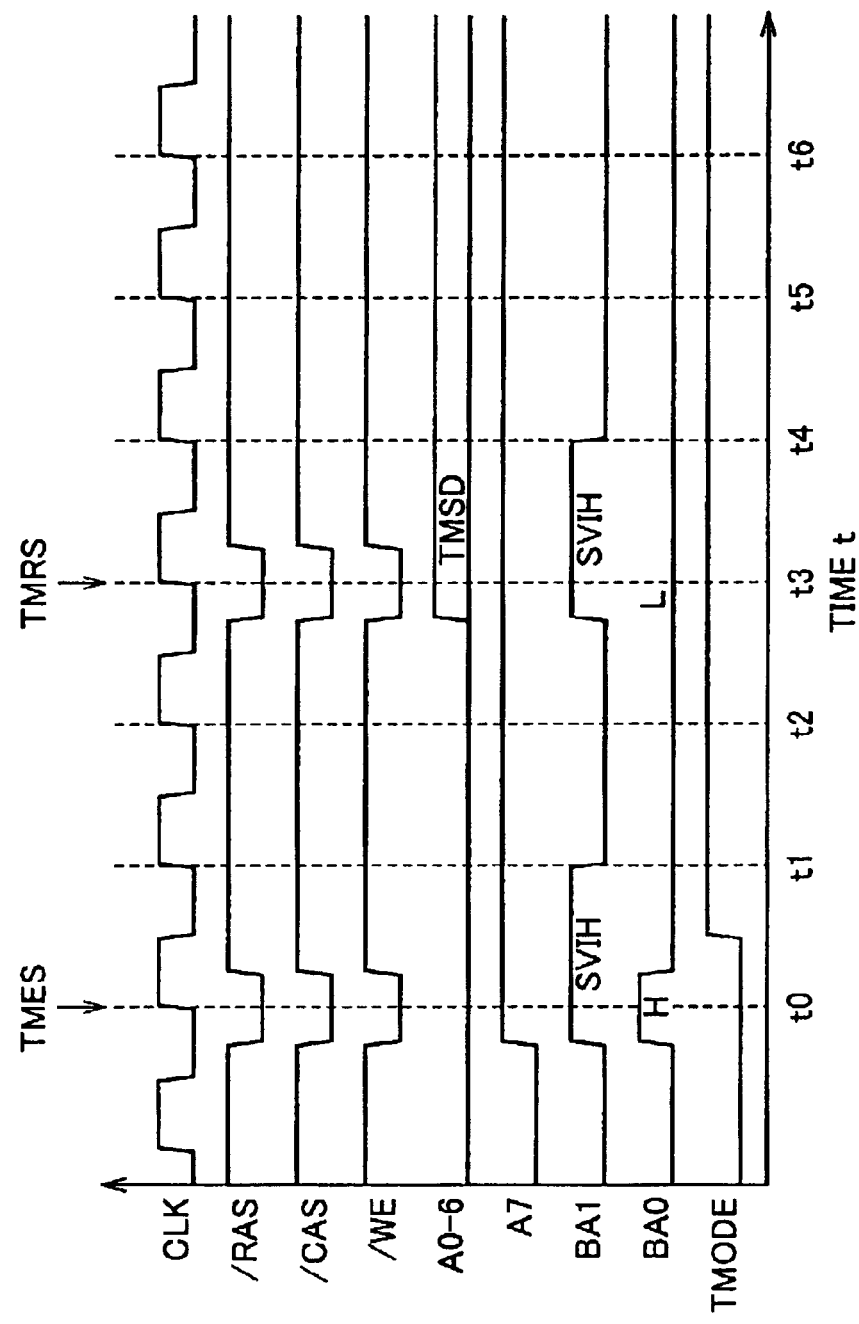
FIG. 11 is another time chart showing the operation of the test mode entry signal generation circuit shown in FIG. 6.
Figure 12:
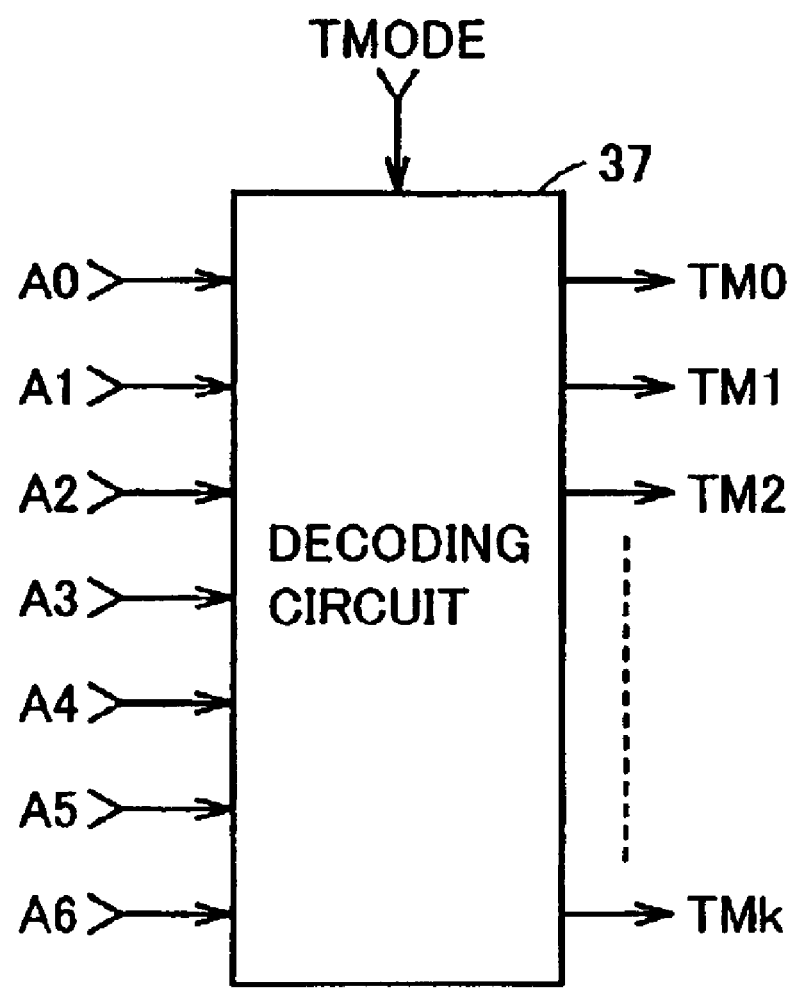
FIG. 12 is a block diagram showing the configuration of a decoding circuit included in DDR SDRAM shown in FIG. 1.

FIG. 11 is another timing chart showing the test mode entry method using high voltage SVIH. In FIG. 11, at the rising edge of clock signal CLK (at time t0), test mode entry set command TMES is inputted, bank select signal BA1 is set at high potential SVIH and the level of test mode entry signal TMODE is raised to "H" level. If the level of test mode entry signal TMODE is raised to "H" level, decoding circuit 37 shown in FIG. 12 is activated.

Next, at the other rising edge of clock signal CLK (at time t3), test mode register set command TMRS (/RAS=L, /CAS=L, /WEL=L, /A7=H and BA0=L) is inputted, bank select signal BA1 is set at high potential SVIH and predetermined test mode set data TMSD is inputted by address signals A0 to A6. Decoder circuit 37 shown in FIG. 12 sets one test mode signal (e.g., TMk) of (k+1) (where k is an integer not smaller than 0) test mode signals TM0 to TMk at active level of "H" level based on test mode set data TMSD (A0 to A6). As a result, DDR SDRAM is set in a test mode corresponding to test mode signal TMk.

Figure 13:
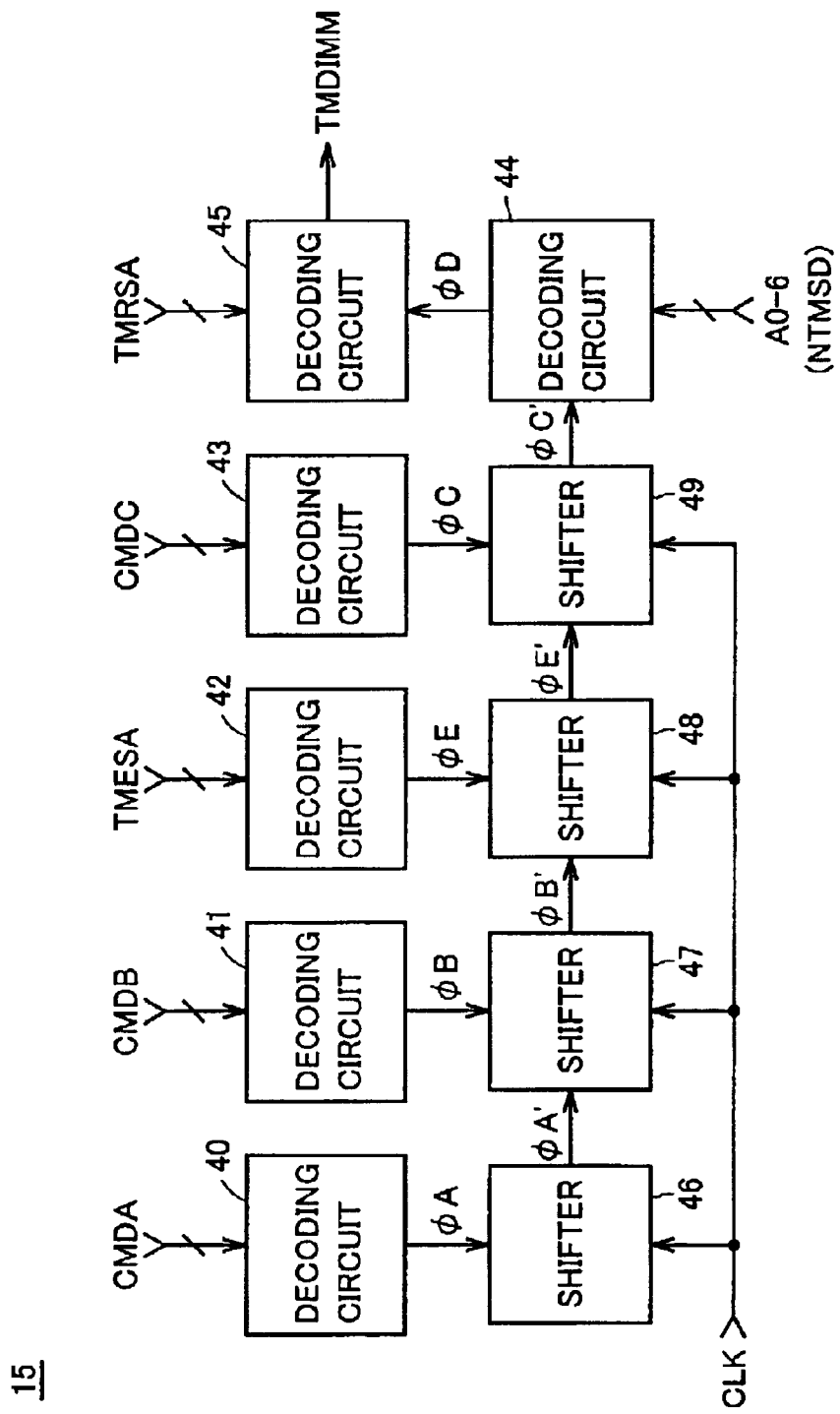
FIG. 13 is a block diagram showing the configuration of a NON-SVIH test mode usage determination circuit shown in FIG. 6.

Next, a test mode entry method without using high voltage SVIH will be described. As shown in FIG. 13, NON-SVIH test mode usage determination circuit 15 includes decoding circuits 40 to 45 and shifters 46 to 49. Decoding circuit 40 sets a signal φA at "H" level for predetermined time in response to a first command CMDA. Shifter 46 operates synchronously with clock signal CLK, delays signal φA by one clock cycle and applies the delayed signal to shifter 47.

Decoding circuit 41 sets a signal φB at "H" level for predetermined time in response to a second command CMDB. Shifter 47 operates synchronously with clock signal CLK, incorporates a signal φB while signal φA' from shifter 46 is at "H" level, delays signal φB by one clock cycle and applies the delayed signal to shifter 48.

Decoding circuit 42 sets a signal φE at "H" level for predetermined time in response to a test mode entry set command TMESA. Shifter 48 operates synchronously with clock signal CLK, incorporates signal φE while signal φB' from shifter 47 is at "H" level, delays signal φE by one clock cycle and applies the delayed signal to shifter 49.

Decoding circuit 43 sets a signal φC at "H" level for predetermined time in response to a third command CMDC. Shifter 49 operates synchronously with clock signal CLK, incorporates a signal φC while signal φE' from shifter 48 is at "H" level, delays signal φC by one clock cycle and applies the delayed signal to shifter 44.

Decoding circuit 44 incorporates address signals A0 to A6 (test mode set data NMSD) in a period that signal φC from shifter 49 is at "H" level, and sets a signal φD at "H" level if the levels of address signals A0 to A6 are a predetermined combination of levels (e.g., A0=A3=A4=H and A1=A5=A6=L).

Decoding circuit 45 is activated if signal φD from decoding circuit 44 is at "H" level and sets signal TMDIMM at "H" level in response to test mode register set command TMRSA.

Accordingly, only if five commands CMDA, CMDB, TMESA, CMDC and TMRSA are inputted at one clock cycle's intervals and predetermined address signals A0 to A6 are inputted when command TMRSA is inputted, then signal TMDIMM is set at "H" level. Commands CMDA, CMDB, TMESA, CMDC and TMRSA are inputted according to a combination of the logic levels of signals /RAS, /CAS, /WE, A7, BA0 and the like. The order in which commands CMDA, CMDB, TMESA, CMDC and TMRSA are inputted is not shown in the state transition diagram shown in FIG. 3 but set to an order which is unavailable to a user.

Figure 14:
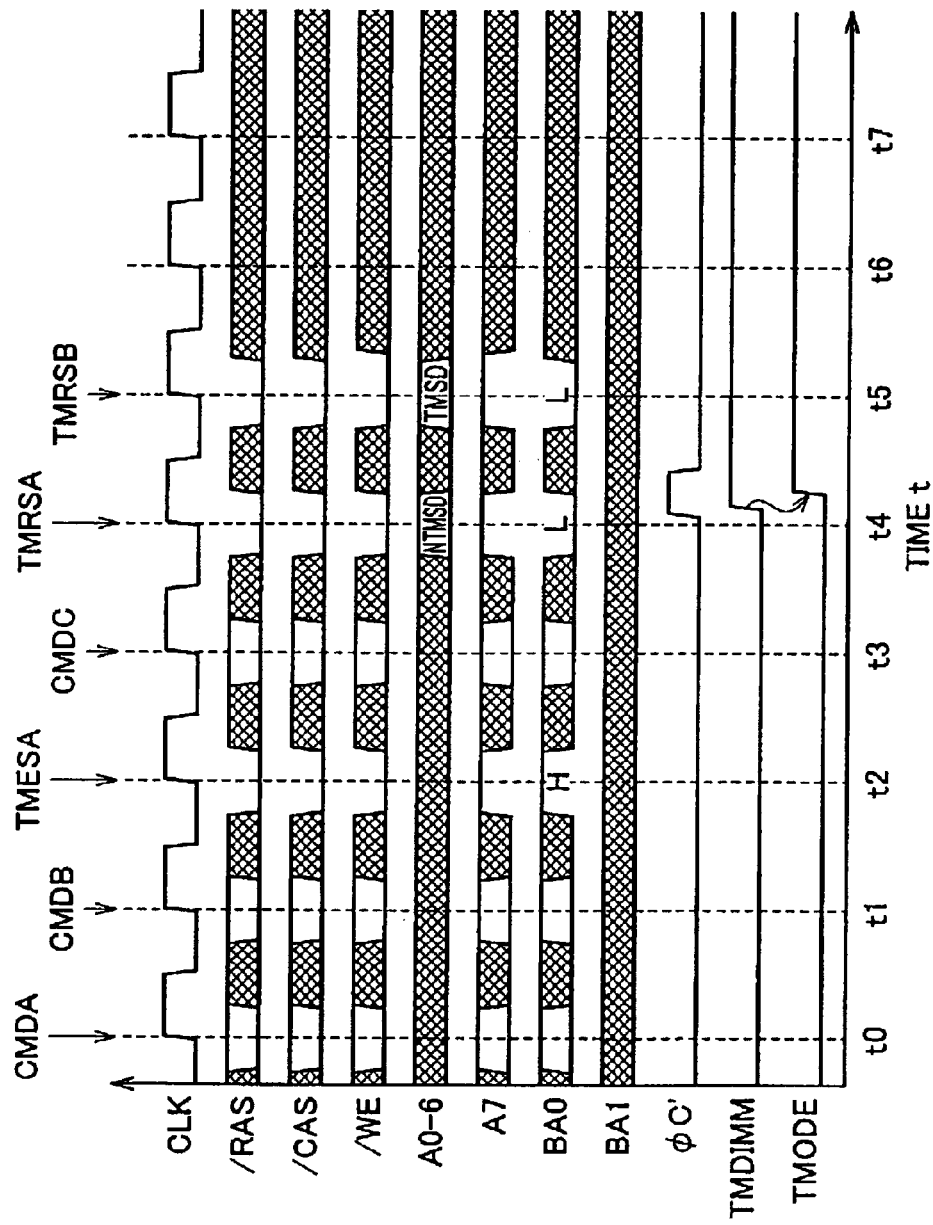
FIG. 14 is a time chart showing the operation of the NON-SVIH test mode usage determination circuit shown in FIG. 6.

FIG. 14 is a time chart showing the test mode entry method without using high voltage SVIH. At a certain rising edge of clock signal CLK (at time t0), first command CMDA is inputted. At the next rising edge of clock signal CLK (at time t1), second command CMDB is inputted. At the next rising edge of clock signal (at time t2), test mode entry set command TMESA (/RAS=L, /CAS=L, /WE=L, A7=H and BA0=H) is inputted.

Next, at the next rising edge of clock signal CLK (at time t3), third command CMDC is inputted. At the next rising edge (at time t4), test mode register set command TMRSA (/RAS=L, /CAS=L, /WE=L, A7=H and BA0=L) is inputted, test mode set data NTMSD is inputted and the levels of signals TMDIMM and TMODE are raised to "H" level, respectively. At the next rising edge of clock signal (at time t5), test mode register set command TMRSB is inputted, test mode set data TMSD is inputted and one test mode (e.g., TM0) out of test mode signals TM0 to TMk is set at active level of "H" level by decoding circuit 37 shown in FIG. 12.

In this first embodiment, test mode entry signal TMOD is outputted in response to the input of five commands CMDA, CMDB, TMESA, CMDC and TMRSA at one clock cycle's intervals. Accordingly, it is possible for DDR SDRAM to enter the test mode without applying high voltage SVIH thereto. It is thereby possible that DDR SDRAM to enter the test mode even if DDR SDRAM is incorporated into registered DIMM. Hence, it is possible to execute an acceleration test, tuning and the like using a test mode in a state of registered DIMM and to thereby improve the efficiency of product evaluation and analysis.

Furthermore, since test mode entry signal TMODE is outputted only if five commands CMDA, CMDB, TMESA, CMDC and TMRSA are inputted at one clock cycle's intervals in this order, it is possible to prevent DDR SDRAM from erroneously entering a test mode while an ordinary user is using DDR SDRAM.

Second Embodiment

Figure 15:
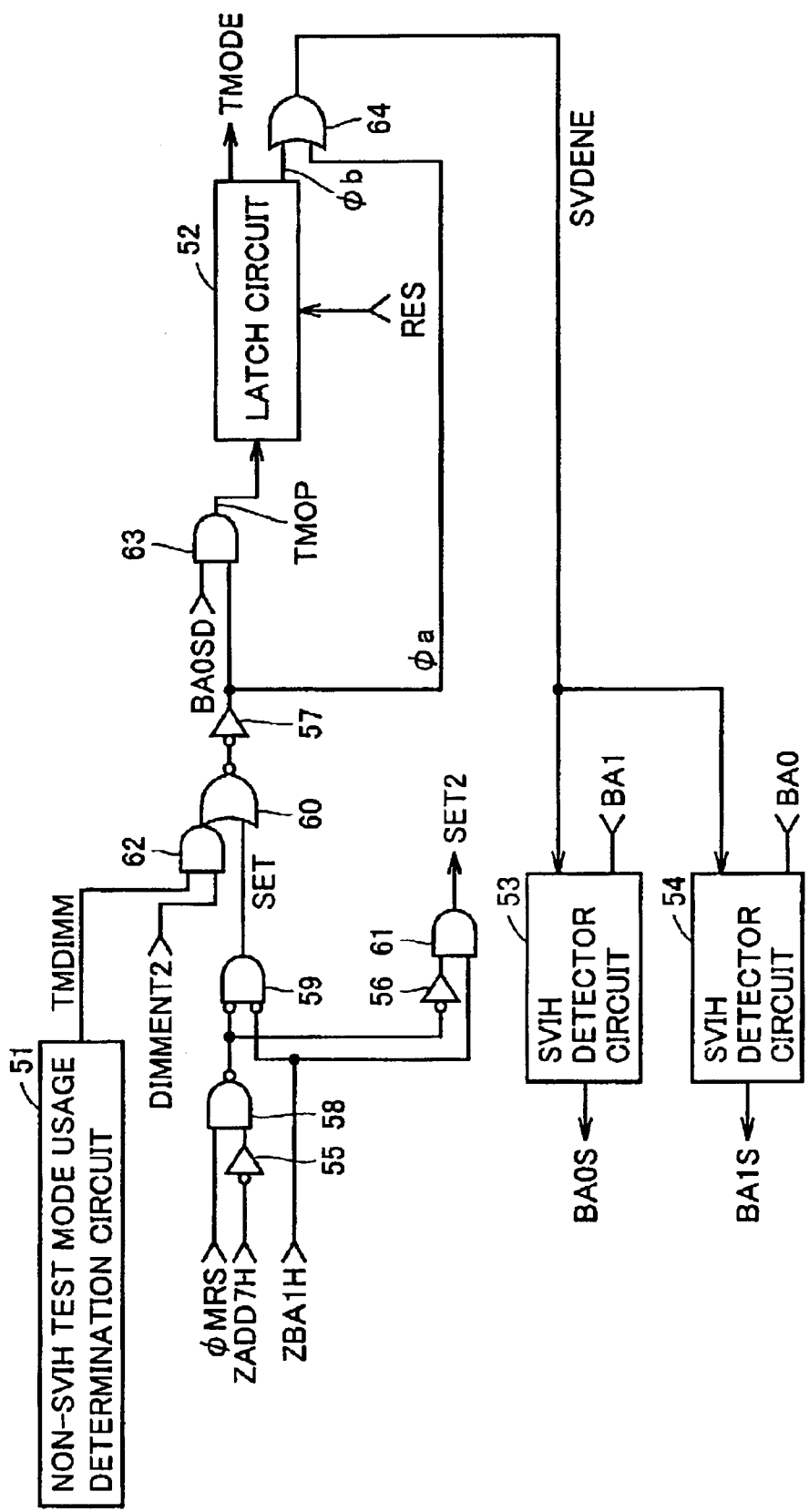
FIG. 15 is a circuit block diagram showing the configuration of a test mode entry signal generation circuit included in DDR SDRAM according to the second embodiment of the present invention.

FIG. 15 is a circuit block diagram showing the important sections of DDR SDRAM according to the second embodiment of the present invention. In FIG. 15, DDR SDRAM includes a NON-SVIH test mode usage determination circuit 51, a latch circuit 52, SVIH detector circuits 53 and 54, inverters 55 to 57, a NAND gate 58, NOR gates 59 and 60, AND gates 61 to 63 and OR gate 64.

A signal φMRS is inputted into one of the input nodes of NAND gate 58. A signal ZADD7H is inputted into the other input node of NAND gate 58 through inverter 55. The output signal of NAND gate 58 is inputted into one of the input nodes of NOR gate 59. A signal ZB1H is inputted into the other input node of NOR gate 59 and also into the other input node of AND gate 61. NOR gate 59 outputs a signal SET and AND gate 61 outputs a signal SET 2.

Figure 16:
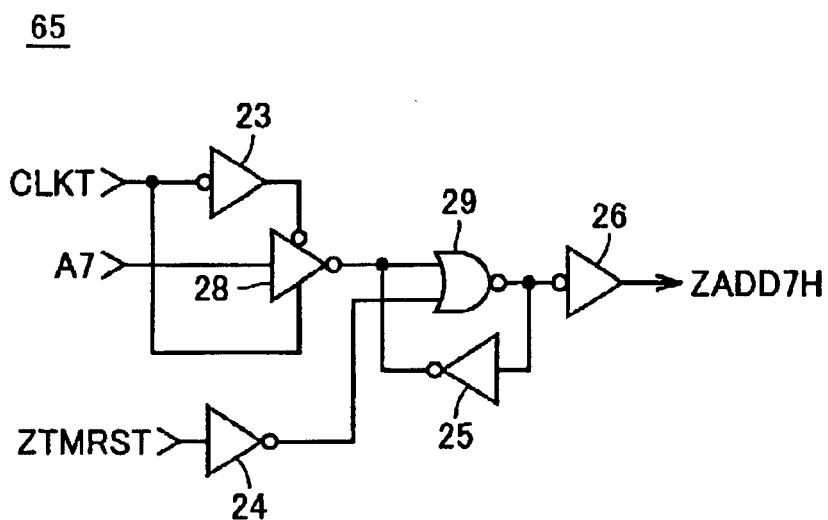
FIG. 16 is a circuit diagram showing the configuration of a latch circuit for generating a signal ZADD7H shown in FIG. 15.

Signal φMRS is a signal which is set at "H" level in response to mode register set command MRS (/RAS=L, /CAS=L and /WE=L). As shown in FIG. 16, signal ZAD7H is generated by latch circuit 65. Latch circuit 65 is constituted so that inverter 27 is eliminated from latch circuit 11 shown in FIG. 7. Address signal A7 is inputted into clocked inverter 28 and signal ADD7H is outputted from inverter 26.

Figure 17:
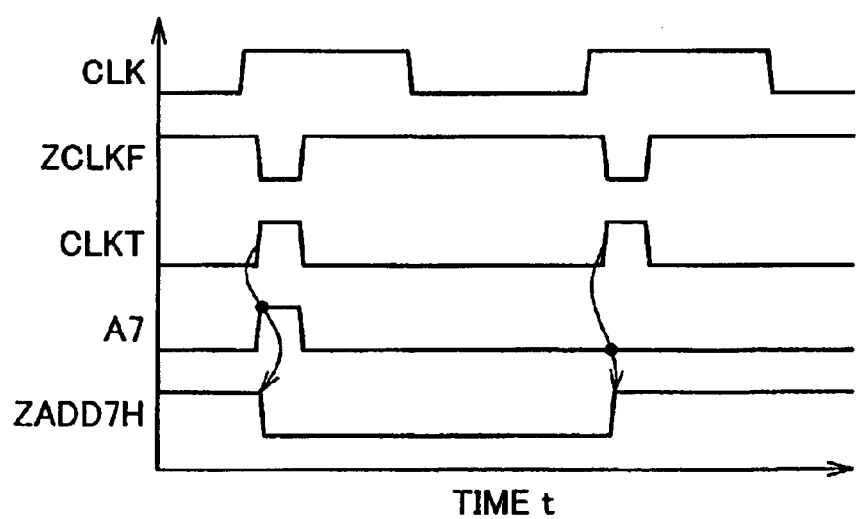
FIG. 17 is a time chart showing the operation of the latch circuit shown in FIG. 16

As shown in FIG. 17, signal CLKT is an inversion signal of signal ZCLKF which is set at "L" level for predetermined time in response to the rising edge of clock signal CLK. Signal ZTMRST is a signal which is normally set at "H" level and which is set at "L" level only when being reset.

In an initial state, signal ZADD7H is reset at "H" level and signal ZTMRST is reset at "H" level. While signal CLKT is at "H" level, clocked inverter 28 is activated, signal A7 is inverted by clocked inverter 28, NOR gate 29 and inverter 26 to become signal ZADD7H. If the level of signal CLKL is caused to fall from "H" level to "L" level, clocked inverter 28 is deactivated and the level of signal ZADD7H is held by NOR gate 29 and inverters 25 and 26 and outputted. As shown in FIG. 17, therefore, if signal A7 is set at "H" level synchronously with signal CLKT, signal ZADD7H is set at "L" level for one clock cycle.

Figure 18:
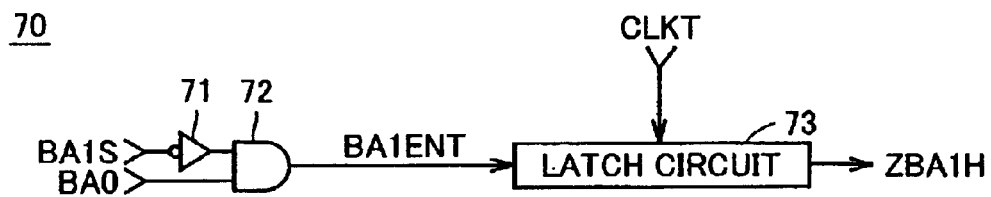
FIG. 18 is a circuit block diagram showing the configuration of a signal generation circuit for generating a signal ZBA1H shown in FIG. 5.

As shown in FIG. 18, signal ZBA1H is generated by a signal generation circuit 70 which includes an inverter 71, an AND gate 72 and a latch circuit 73. The output signal BA1S of SVIH detector circuit 54 is inputted into one of the input nodes of AND gate 72 through inverter 71. Bank select signal BA0 is inputted into the other input node of AND gate 72. The output signal BA1ENT of AND gate 72 is applied to latch circuit 73 and the output signal of latch circuit 73 becomes ZBA1H. Therefore, if signals BA1S and BA0 are set at "L" level and "H" level synchronously with the rising edge of clock signal CLKT, respectively, the level of signal ZBA1H becomes "L" level.

Accordingly, signal SET is set at "H" level in response to test mode entry set command TMESA (/RAS=L, /CAS=L, /WE=L, A7=H and BA0 =H), and signal SET2 is set at "H" level in response to test mode register set command TMRSA (/RAS=L, /CAS=L, /WE=L, A7=H and BA0=L).

Referring back to FIG. 15, NON-SVIH test mode usage determination circuit 51 is a circuit which sets signal TMDIMM at "H" level in response to a test mode setting command without using high voltage SVIH. NON-SVIH test mode usage determination circuit 51 will be described later in detail. AND gate 62 receives signals TMDIMM and DIMMENT2. Signal DIMMENT2 is a signal generated in NON-SVIH test mode usage determination circuit 51. NOR gate 60 receives the output signal of AND gate 62 and signal SET. The output signal of NOR gate 60 is inputted into one of the input nodes of AND gate 63 and one of the input nodes of NOR gate 64 through inverter 57. Signal BA0SD is inputted into the other input node of AND gate 63.

Figure 19:
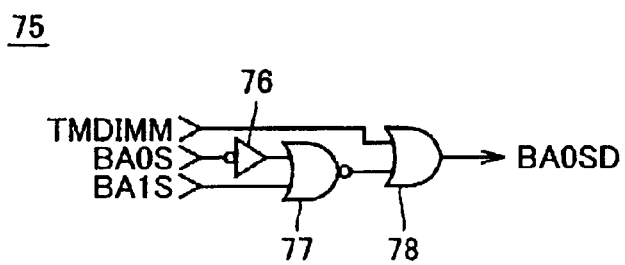
FIG. 19 is a circuit diagram showing the configuration of a signal generation circuit for generating a signal BA0SD shown in FIG. 15.

Signal BA0SD is generated by a signal generation circuit 75 which includes an inverter 76, a NOR gate 77 and an OR gate 78 as shown in FIG. 19. Output signal TMDIMM of NON-SVIH test mode usage determination circuit 51 is inputted into one of the input nodes of OR gate 78. Output signal BA0S of SVIH detector circuit 53 is inputted into one of the input nodes of NOR gate 77 through inverter 76. Output signal BA1S of SVIH detector circuit 54 is inputted into the other input node of NOR gate 77. The output signal of NOR gate 77 is inputted into the other input node of OR gate 78. The output signal of OR gate 78 becomes signal BA0SD. Therefore, signal BA0SD is set at "H" level if output signal TMDIMM of NON-SVIH test mode usage determination circuit 51 is set at "H" level or output signals BA0S and BA1S of SVIH detector circuits 53 and 54 are set at "H" level and "L" level, respectively.

Figure 20:
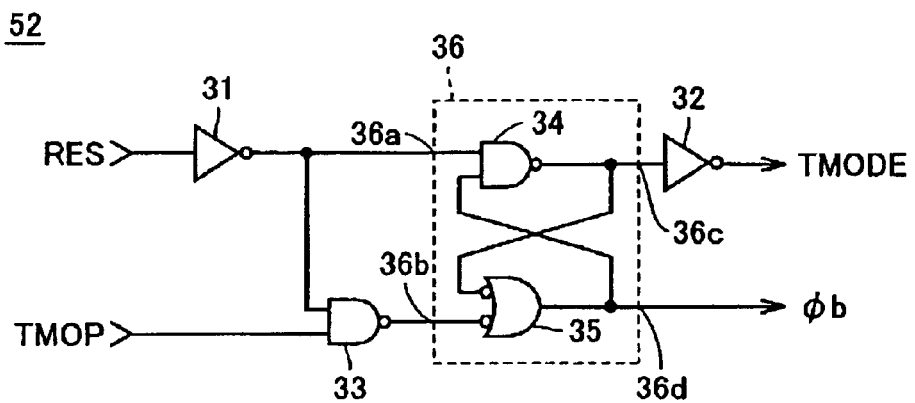
FIG. 20 is a circuit diagram showing the configuration of the latch circuit shown in FIG. 15.

Output signal TMOP of AND gate 63 is inputted into latch circuit 52. As shown in FIG. 20, latch circuit 52 is the same in configuration as latch circuit 22 shown in FIG. 9. The output signal of inverter 32 becomes test mode entry signal TMODE and a signal φb is outputted from the output terminal 36d of flip-flop 36.

If reset signal RES is set at "H" level, flip flop 36 is reset and signals TMODE and φb are both reset at "L" level. Normally, reset signal RES is set at "L" level. If the level of signal TMOP is raised to "H" level, flip-flop 36 is set to thereby raise the levels of both of signals TMODE and φb to "H" level.

Referring back to FIG. 15, signal φb is inputted into the other input node of OR gate 64. Output signal SVDENE of OR gate 64 is inputted into SVIH detector circuits 53 and 54. SVIH detector circuit 53, which is activated if signal SVDENE is at "H" level, sets signal BA0S at "L" level if the potential of bank select signal BA1 is lower than high potential SVIH and sets signal BA0S at "H" level if the potential of bank select signal BA1 is higher than high potential SVIH. SVIH detector circuit 54, which is activated if signal SVDENE is at "H" level, sets signal BA1S at "L" level if the potential of bank select signal BA0 is lower than high potential SVIH and sets signal BA1S at "H" level if the potential of bank select signal BA0 is higher than high potential SVIH.

Next, a test mode entry method using high voltage SVIH will be described. If test mode entry set command TMESA (/RAS=L, /CAS=L, /WE=L, A7=H and BA0=H) is inputted, signal SET is set at "H" level and signals φa and SVDENE are set at "H" level, respectively, thereby activating SVIH detector circuits 53 and 54. If bank select signals BA1 and BA0 are set at high potential SVIH and "H" level, respectively, while SVIH detector circuits 53 and 54 are activated, output signals BA0S and BA1S of SVIH detector circuits 53 and 54 are set at "H" level and "L" level, respectively to thereby set signal BA0SD at "H" level. As a result, output signal TMOP of AND gate 63 is set at "H" level and the level of test mode entry signal TMODE is raised to "H" level. In addition, the level of signal φb is also raised to "H" level, signal SVDENE remains at "H" level even after the input of test mode entry set command TMESA is stopped, and SVIH detector circuits 53 and 54 are kept in an active state.

Figure 21:
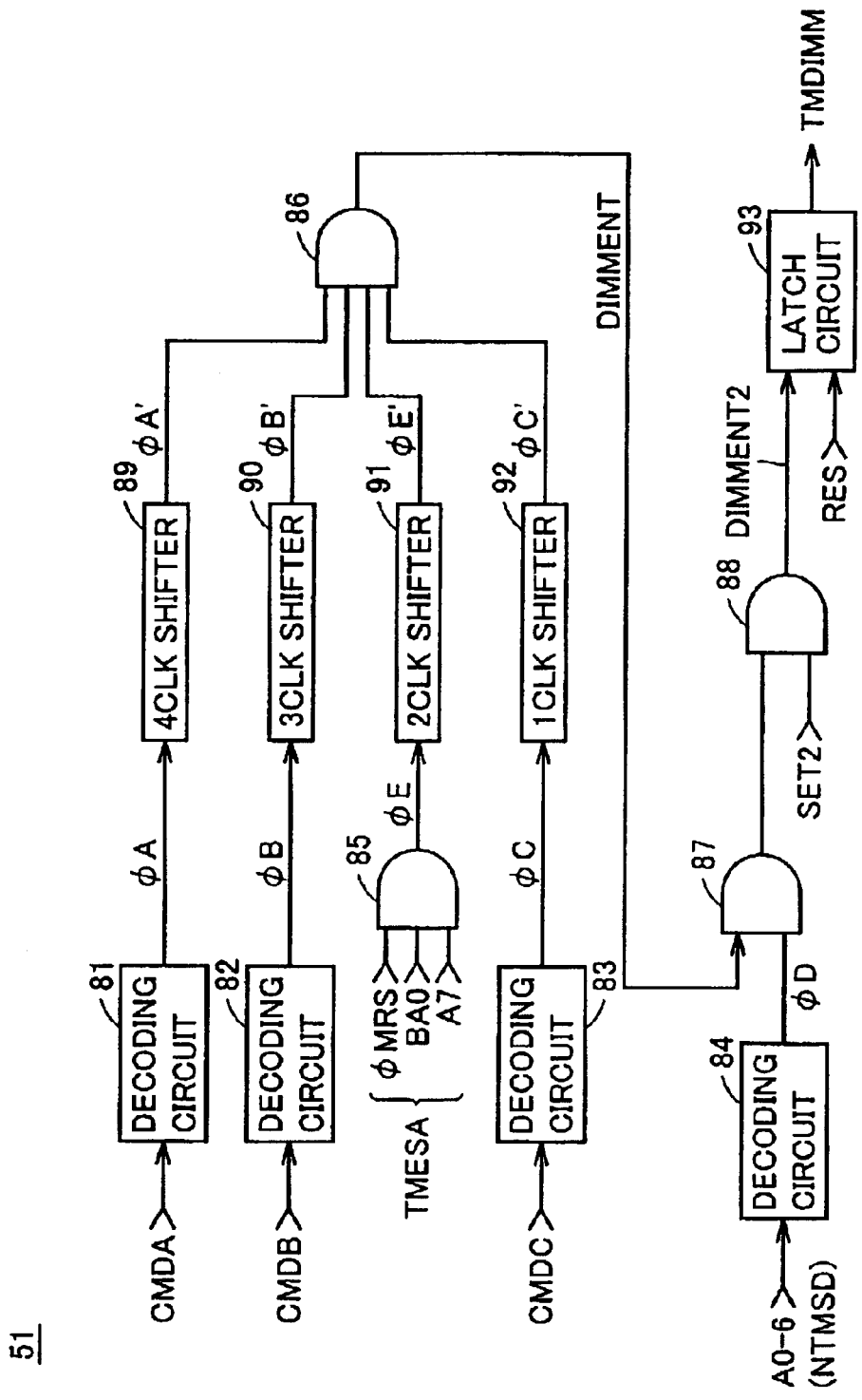
FIG. 21 is a block diagram showing the configuration of a NON-SVIH test mode usage determination circuit shown in FIG. 15.

A test mode entry method without using high voltage SVIH will next be described. FIG. 21 is a circuit block diagram showing the configuration of NON-SVIH test mode usage determination circuit 51. In FIG. 21, this NON-SVIH test mode usage determination circuit 51 includes decoding circuits 81 to 84, AND gates 85 to 88, shifters 89 to 92 and a latch circuit 93.

Decoding circuit 81 is set signal φA at "H" level in response to first command CMDA. Decoding circuit 82 is set signal φB at "H" level in response to second command CMDB. AND gate 85 sets signal φE at "H" level in response to test mode entry set command TMESA. Decoding circuit 83 sets signal φC at "H" level in response to third command CMDC.

Sifter 89 operates synchronously with clock signal CLK, delays output signal φA of decoding circuit 81 by four clock cycles and generates signal φA'. Sifter 90 operates synchronously with clock signal CLK, delays output signal φB of decoding circuit 82 by three clock cycles and generates signal φB'. Sifter 91 operates synchronously with clock signal CLK, delays output signal φE of AND gate 85 by two clock cycles and generates signal φE'. Sifter 92 operates synchronously with clock signal CLK, delays output signal φC of decoding circuit 83 by one clock cycle and generates signal φC'. Signals φA', φB', φE' and φC' are inputted into AND gate 86. The output signal of AND gate 86 becomes a signal DIMMENT.

Figure 22:
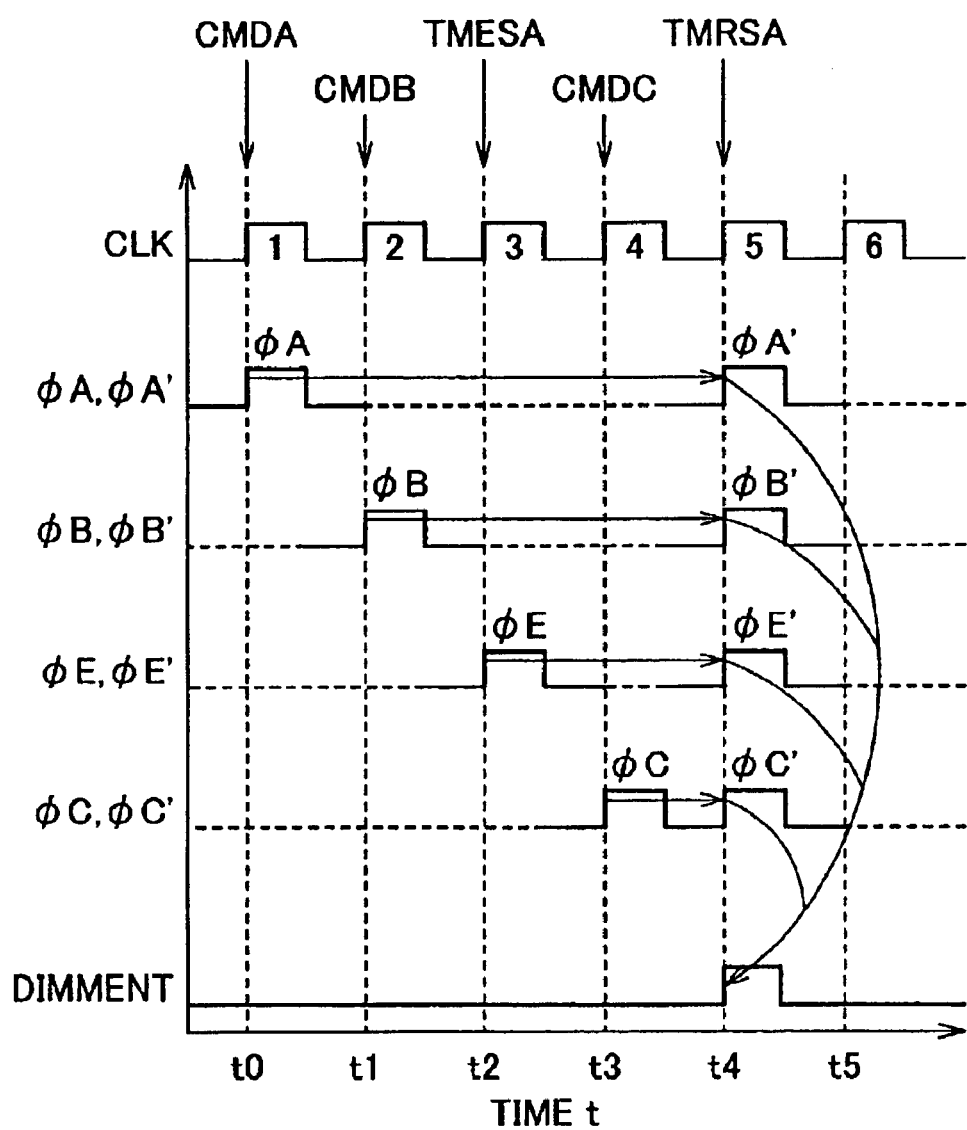
FIG. 22 is a time chart showing the operation of the NON-SVIH test mode usage determination circuit shown in FIG. 15.

As shown in FIG. 22, if signals φA, φB, φE and φC are set at "H" level synchronously with first to fourth rising edges of clock signal CLK, respectively, then the levels of signals φA', φB', φE' and φC' all become "H" level and the level of signal DIMMENT is raised to "H" level.

Referring back to FIG. 21, decoding circuit 84 sets signal φD at "H" level in response to test mode set data NTMSD (address signals A0 to A7). Signal φD is inputted into the other input node of AND gate 87. AND gate 88 receives the output signal of AND gate 87 and signal SET2 and output signal DIMMENT2 of AND gate 88 is applied to latch circuit 93.

Figure 23:
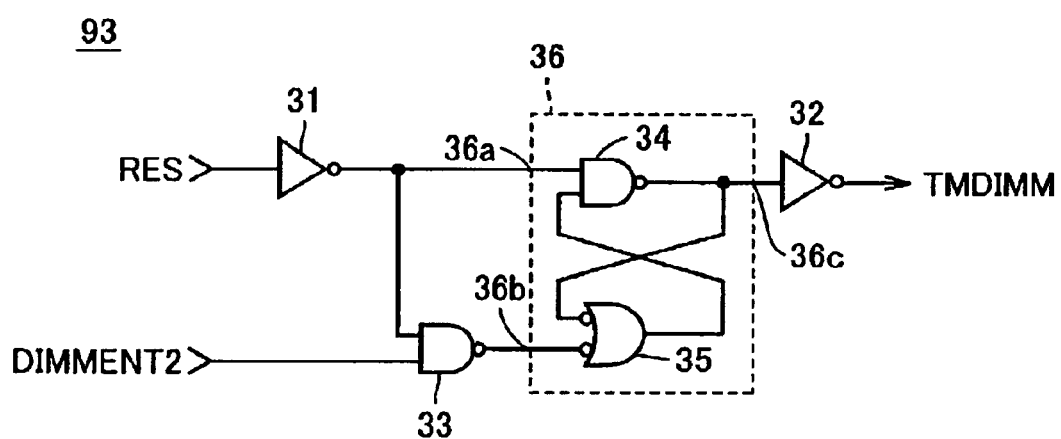
FIG. 23 is a circuit diagram showing the configuration of a latch circuit shown in FIG. 21.

As shown in FIG. 23, latch circuit 93 is the same in configuration as latch circuit 22 show in FIG. 9. Signal DIMMENT2 is inputted into the other input node of NAND gate 32 and the output signal of inverter 31 becomes TMDIMM. If reset signal RES is set at "H" level, flip-flop 36 is reset and signal TMDIMM is reset at "L" level. Normally, reset signal RES is set at "L" level. If the level of signal DIMMENT2 is raised to "H" level, flip-flop 36 is set and the level of signal TMDIMM is raised to "H" level.

The level of signal SET 2 becomes "H" level in response to test mode register set command TMRSA. Therefore, the levels of signals DIMMENT2 and TMDIMM are raised to "H" level only if test mode command TMRSA and test mode set data NTMSD are inputted while signal DIMMENT is at "H" level. If signal DIMMENT2 and data TMDIMM are set at "H" level, the level of the output signal of AND gate 62 shown in FIG. 15 becomes "H" level and that of signal φa becomes "H" level. Further, the level of output signal BA0SD of OR gate 78 shown in FIG. 19 becomes "H" level and that of output signal TMOP of AND gate 63 shown in FIG. 15 becomes "H" level. Accordingly, the level of test mode entry signal TMODE becomes "H" level.

Figure 24:
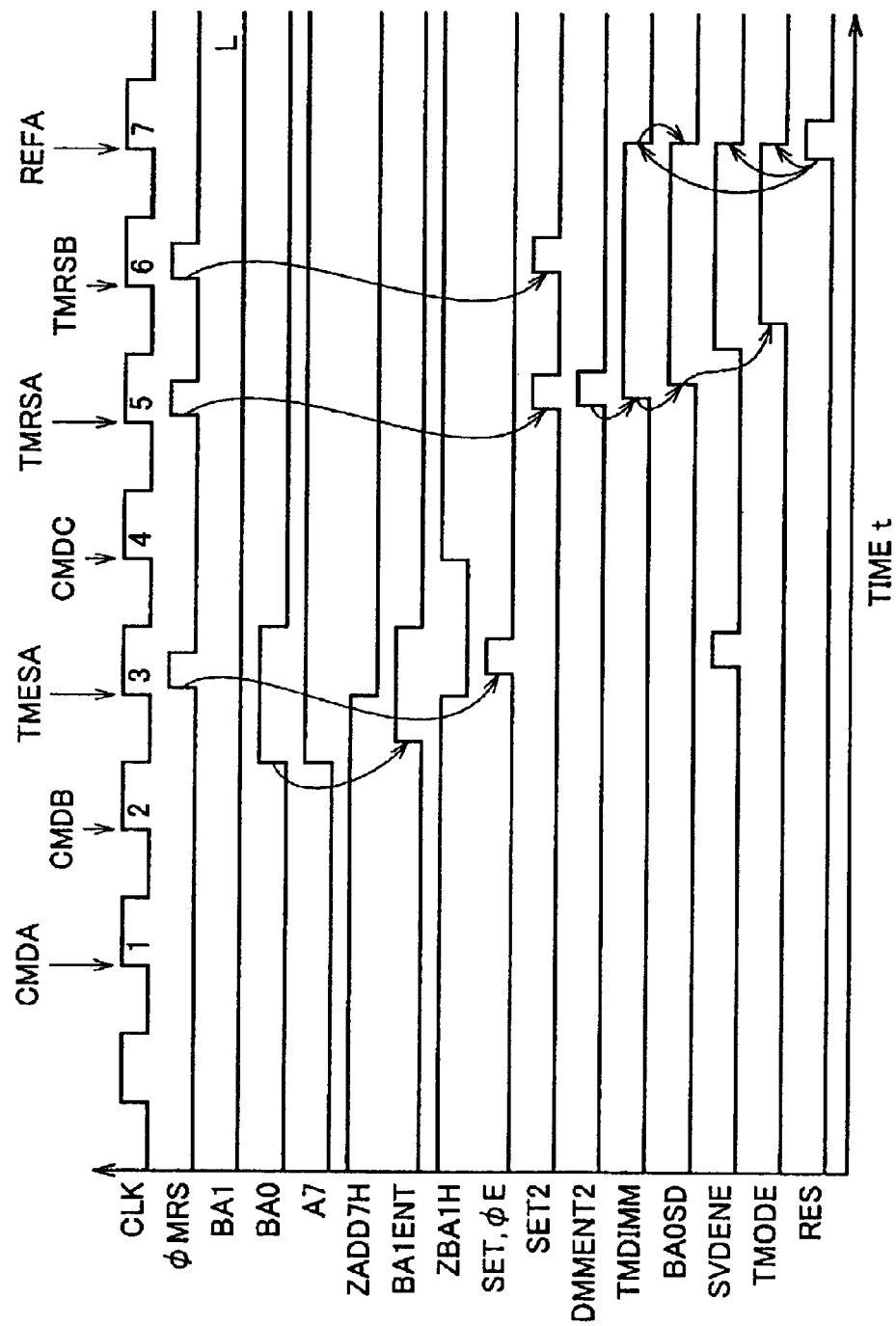
FIG. 24 is a time chart showing the operation of the test mode entry signal generation circuit shown in FIG. 15.

FIG. 24 is a time chart showing the test mode setting method without using high voltage SVIH. In FIG. 24, first command CMDA, second command CMDB, test mode entry set command TMESA, third command CMDC and test mode register set command TMRSA are inputted synchronously with the first to fifth rising edges of clock signal CLK, respectively.

If test mode entry set command TMESA (/RAS=L, /CAS=L, /WE=L, BA0=H and A7=H) is inputted, then the level of signal φMRS becomes "H" level, those of signals ZADD7H and ZBAH become "L" level and those of signals SET and φa become "H" level. If test mode entry command TMRSA (/RAS=L, /CAS=L, /WE=L, BA0=L and A7=H) and test mode set data NTMSD are inputted, then the levels of signals φMRS and ZBA1H become "H" level, that of signal ZADD7H becomes "L" level and that of signal SET2 becomes "H" level. If the level of signal SET2 becomes "H" level, the levels of signals DIMMENT2, TMDIMM, BA0SD and TMOP are sequentially raised to "H" level and that of test mode entry signal TMODE is raised to "H" level.

Next, if test mode register set command TMRSB and test mode set data TMSD are inputted, the level of a desired test mode signal (e.g., TM0) out of a plurality of test mode signals TM0 to TMk is raised to active level of "H" level by decoding circuit 37 shown in FIG. 12.

If DDR SDRAM completes with a test and auto-refresh command REFA is inputted, then the level of reset signal RES is raised to "H" level and signals TMDIMM, BA0SD, SVDENE and TMODE are all reset at "L" level.

This second embodiment exhibits the same advantages as those of the first embodiment.

Third Embodiment

Figure 25:
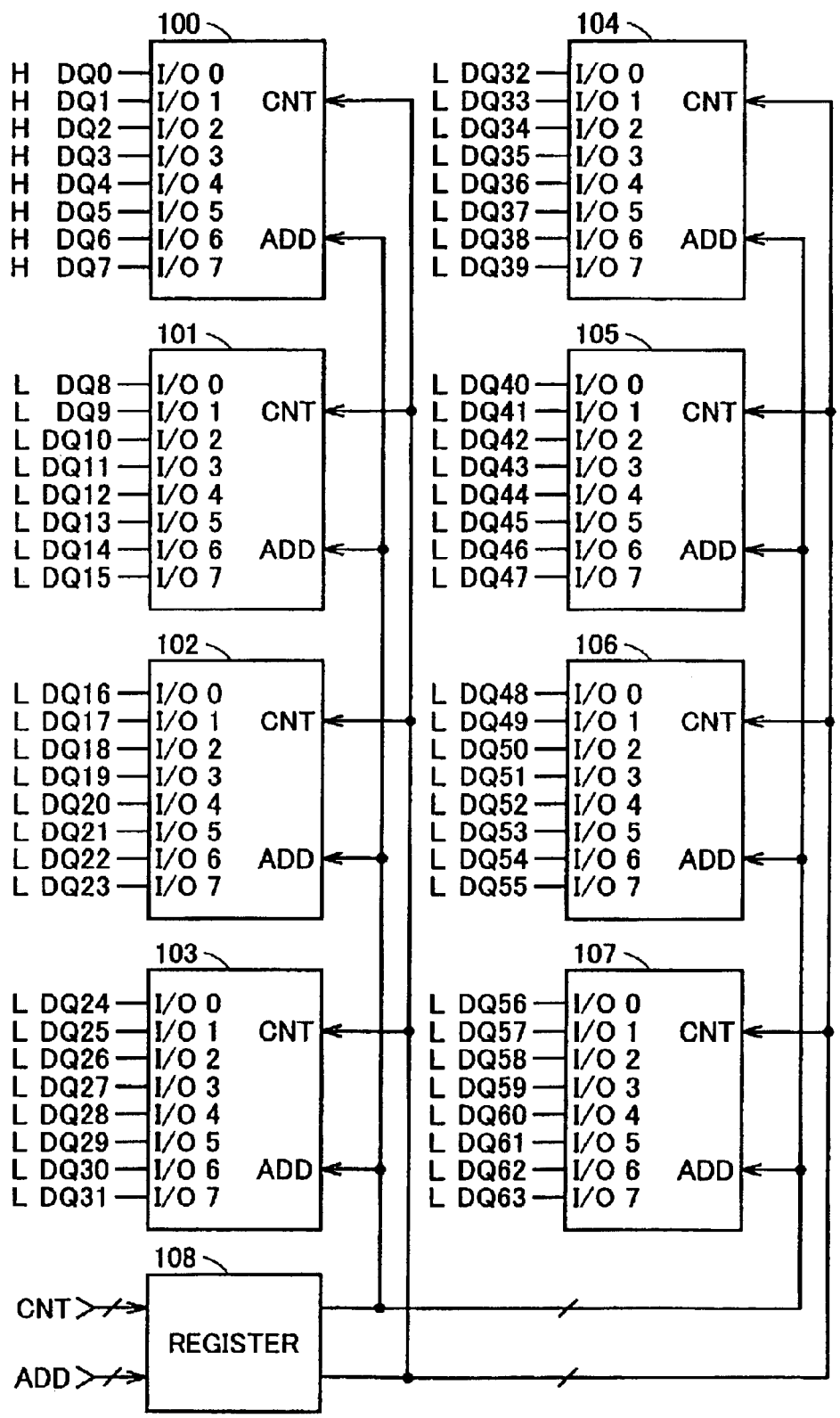
FIG. 25 is a block diagram showing the configuration of a registered DIMM according to the third embodiment of the present invention.

FIG. 25 is a block diagram showing the configuration of registered DIMM according to the third embodiment of the present invention. In FIG. 25, registered DIMM includes eight DDR SDRAM 100 to 107 and a register 108.

The test mode setting circuits without using high voltage SVIH shown in the first and second embodiments are mounted on each of DDR SDRAM 100 to 107. In addition, each of DDR SDRAM 100 to 107 includes eight data input/output terminals I/O0 to I/O7. Accordingly, this DIMM can simultaneously input/output 8×8=64 data signals.

Register 108 incorporates external control signal CNT (/CAS, /RAS, /CAS, /WE, . . . ) and external address signal ADD (A0 to Am, B0, B1) synchronously with clock signal CLK and applies incorporated control signals CNT and address signal AD to eight SDRAM 100 to 107 in parallel.

Figure 26:
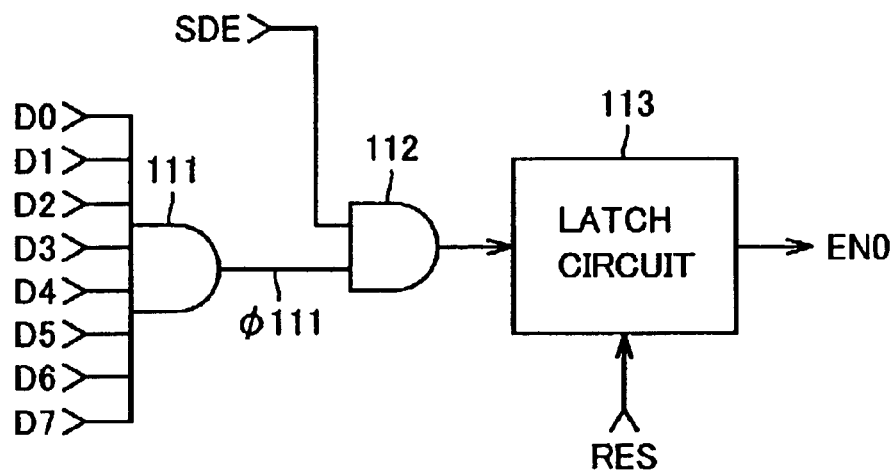
FIG. 26 is a circuit block diagram showing the configuration of a signal generation circuit included in DDR SDRAM shown in FIG. 25.

FIG. 26 is a circuit block diagram showing the configuration of a signal generation circuit 110 provided in SDRAM 100. In FIG. 26, this signal generation circuit 100 includes AND gates 111 and 112 and a latch circuit 113. AND gate 111 receives data signals D0 to D7 applied from the outside of DIMM. AND gates 112 receives the output signal φ111 of AND gate 111 and a test mode signal SDE (e.g., TM0). Test mode signal SDE is a signal generated by the test mode setting method without using high voltage SVIH shown in the first and second embodiments. Latch circuit 113, which is the same in configuration as latch circuit 22 shown in FIG. 9, resets a signal EN0 at "L" level in response to the setting of reset signal RES at "H" level and raises the level of signal EN0 to active level of "H" level in response to the setting of the output signal of AND gate 112 at "H" level.

Figure 27:
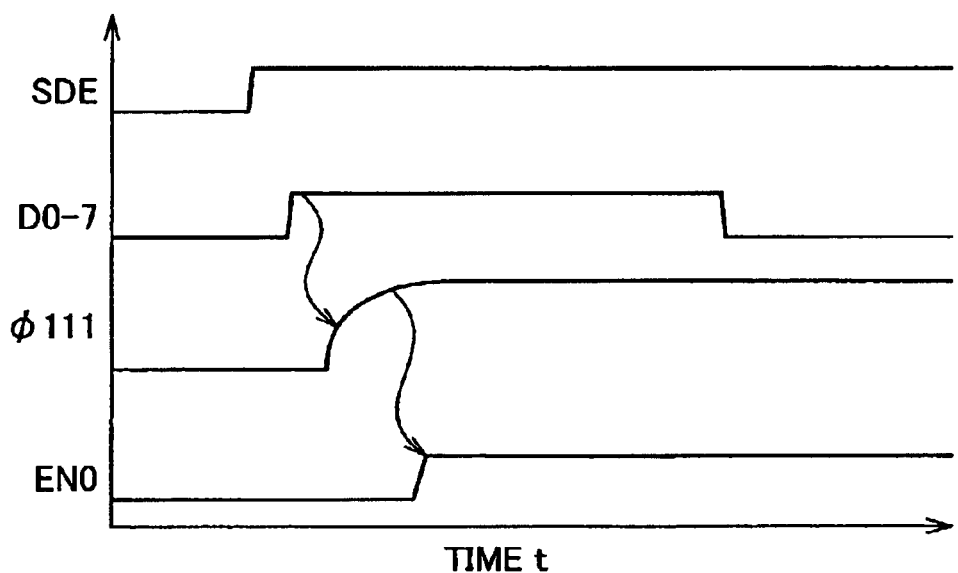
FIG. 27 is a time chart showing the operation of the signal generation circuit shown in FIG. 26.

FIG. 27 is a time chart showing the operation of signal generation circuit 110 shown in FIG. 26. In FIG. 27, if the level of test mode signal SDE is raised to "H" level by the test mode setting method without using high voltage SVIH and the levels of data signals D0 to D7 corresponding to SDRAM 100 are all set "H" level, then the level of the output signal φ111 of AND gate 111 is raised to "H" level that of signal EN0 is raised to "H" level in latch circuit 113. If the level of signal EN0 is raised to "H" level, SDRAM 100 turns into a selected state. Signal generation circuit 110 is provided in each of the other SDRAM 101 to 107. Signal generation circuits 110 of SDRAM 101 to 107 generate signals EN1 to EN7, respectively. SDRAM 101 to 107 are turned into selected states in response to the setting of signals EN1 to EN7 at "H" level, respectively.

Figure 28:
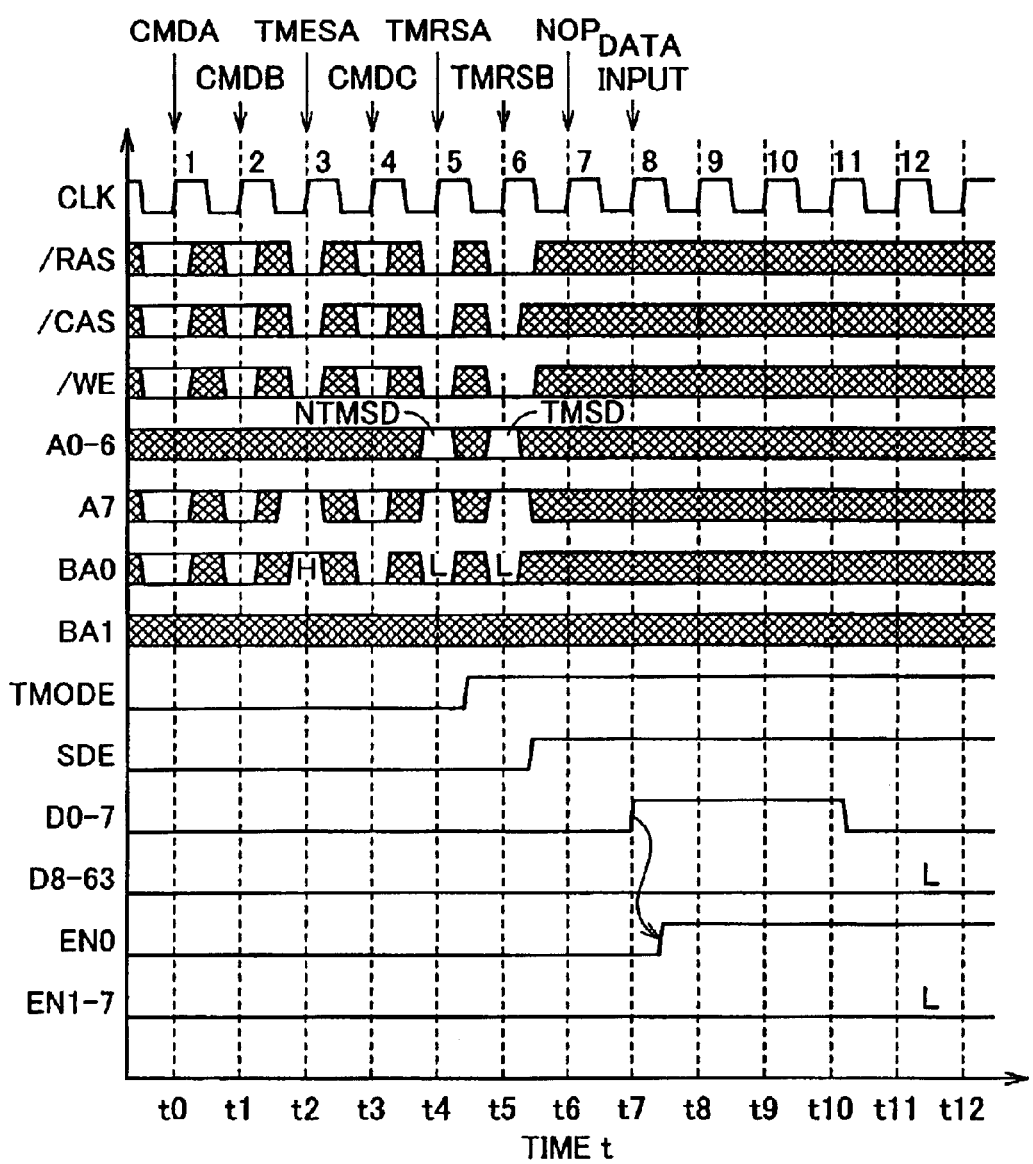
FIG. 28 is a time chart showing the operation of the registered DIMM shown in FIG. 25.

FIG. 28 is a time chart showing the test mode setting method without using high voltage SVIH for this DIMM. In FIG. 28, first command CMDA, second command CMDB, test mode entry set command TMESA, third command CMDC and test mode register set command TMRSA are inputted synchronously with the first to fifth rising edges of clock signals (at time t0 to time t4), respectively, and the level of test mode entry signal TMODE is raised to "H" level.

A test mode register set command TMRSB in addition to test mode set data TMSD for setting a specific device select test mode is inputted synchronously with the sixth rising edge of clock signal CLK (at time t5), and the level of test mode signal SDE is raised to "H" level.

Next, the levels of data signals (which are D0 to D7 in this case) are raised to "H" level and those of other data signals D8 to D63 are raised to "L" level synchronously with the eighth rising edge of clock signal CLK (at time t7). As a result, only SDRAM 100 among SDRAM 100 to 107 is turned into a selected state.

In this third embodiment, desired SDRAM (e.g., SDRAM 100) is selected from among a plurality of SDRAM 100 to 107 included in registered DIMM and a test mode can be executed only to SDRAM 100.

It goes without saying that even a memory system constituted to eliminate register 108 from registered DIMM shown in FIG. 25 exhibits the same advantages.

Fourth Embodiment

In the fourth embodiment, a method for selecting a desired SDRAM (e.g., SDRAM 100) among eight SDRAM 100 to 107 mounted on DIMM and programming the defective address of SDRAM 100 by the test mode entry method without using high voltage SVIH will be described. The defective address is programmed by determining whether each of a plurality of fuses is blown.

Figure 29:
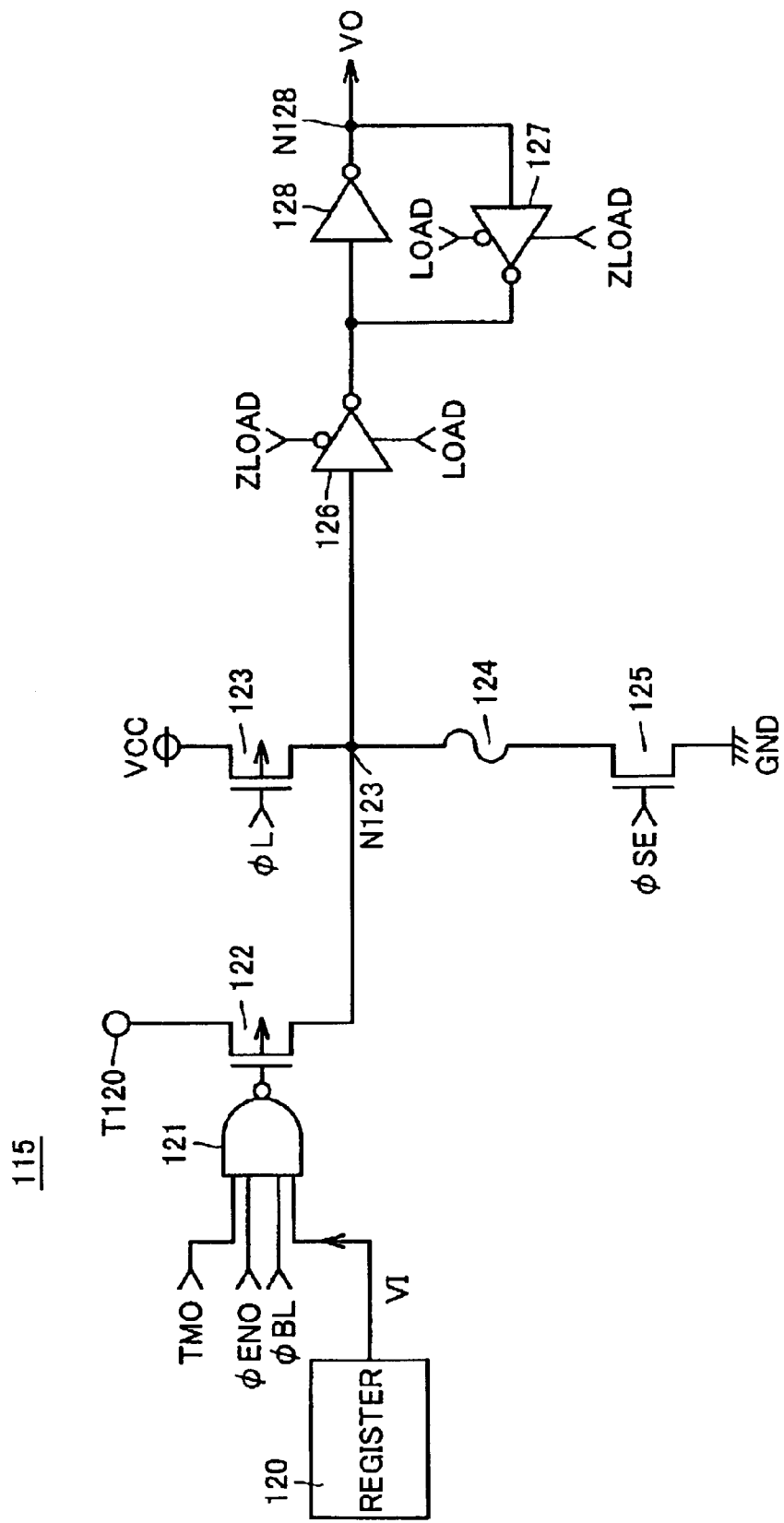
FIG. 29 is a circuit diagram showing the configuration of a fuse circuit included in DDR SDRAM of a registered DIMM according to the fourth embodiment of the present invention.

FIG. 29 is a circuit diagram showing the configuration of a fuse circuit 115 provided in each of SDRAM 100 to 107. This fuse circuit 115 stores one address signal among a plurality of address signals which indicates a defective address. Each of SDRAM 100 to 107 is provided with at least a set of a plurality of fuse circuits for storing a plurality of address signals. In FIG. 29, fuse circuit 115 includes a high voltage application terminal T120, a register 120, an AND gate 121, P-channel MOS transistors 122 and 123, a fuse 124, an N-channel MOS transistor 125, clocked inverters 126 and 127 and an inverter 128.

Register 120 holds and outputs a corresponding address signal VI applied from the outside. AND gate 121 receives a test mode signal TM0, an activation signal EN0, a blow signal φBL and the output signal VI of register 120 for blowing fuse 124. P-channel MOS transistor 122 is connected between high voltage application terminal 120 and a node 123 and the gate of P-channel MOS transistor 122 receives the output signal of NAND gate 121. Fuse 124 and N-channel MOS transistor 125 are connected in series between node N123 and a ground potential GND line and the gate of N-channel MOS transistor 125 receives a signal SE.

If blowing fuse 124 of SDRAM 100, signals TM0, φEN0 and VI are set at "H" level and signal φSE is set at "H" level to make N-channel MOS transistor 125 conductive. Next, high voltage VH is applied to terminal T120, blow signal φBL is set at "H" level to make P-channel MOS transistor 122 conductive, and an overcurrent is carried to fuse 124 to thereby blow fuse 124.

Further, P-channel MOS transistor 123 is connected between a power supply potential VCC line and node N123 and the gate of P-channel MOS transistor 123 receives a signal φL. Clocked inverter 126 and inverter 128 are connected in series between node N123 and output node N128. Clocked inverter 127 is connected in antiparallel to inverter 128. Clocked inverter 126 is activated in response to the setting of signals LOAD and ZLOAD at "H" level and "L" level, respectively and clocked inverter 127 is activated in response to the setting of signals LOAD and ZLOAD at "L" level and "H" level, respectively. Inverters 126 to 128 constitute a latch circuit.

Figure 30:
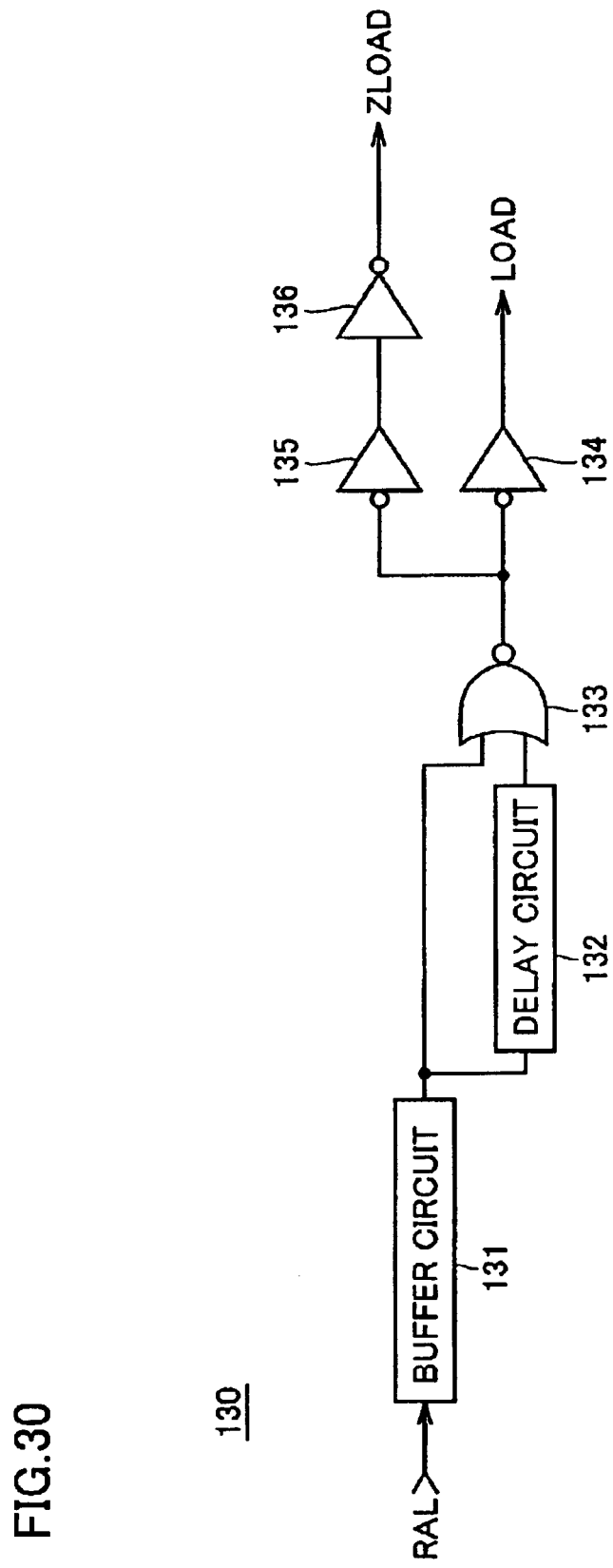
FIG. 30 is a circuit block diagram showing the configuration of a signal generation circuit for generating signals LOAD and ZLOAD shown in FIG. 29.

FIG. 30 is a circuit block diagram showing the configuration of a signal generation circuit 130 generating signals LOAD and ZLOAD. In FIG. 30, this signal generation circuit 130 includes a buffer circuit 131, a delay circuit 132, a NOR gate 133 and inverters 134 to 136. A signal RAL is inputted into one of the input nodes of NOR gate 133 through buffer circuit 131 and also into the other input node of NOR gate 133 through buffer circuit 131 and delay circuit 132. The output signal of NOR gate 133 is inverted by inverter 134 to become signal LOAD and delayed by inverters 135 and 136 to become signal ZLOAD. Signal RAL is a row-related activation signal which is set at "H" level for predetermined time in response to the setting of external control signal /RAS at "L" level.

In an initial state, signal RAL is set at "L" level and signals LOAD and ZLOAD are set at "L" level and "H" level, respectively. If the level of signal RAL is raised from "L" level to "H" level, the levels of signals LOAD and ZLOAD become "H" level and "L" level, respectively. If the level of signal RAL is caused to fall from "H" level to "L" level while the output signal of delay circuit 132 is at "H" level, then the level of the output signal of delay circuit 132 becomes "L" level after the passage of the delay time of delay circuit 132 and the levels of signals LOAD and ZLOAD become "L" level and "H" level, respectively. Accordingly, signal LOAD becomes a signal obtained by delaying the falling edge of signal RAL.

Figure 31:
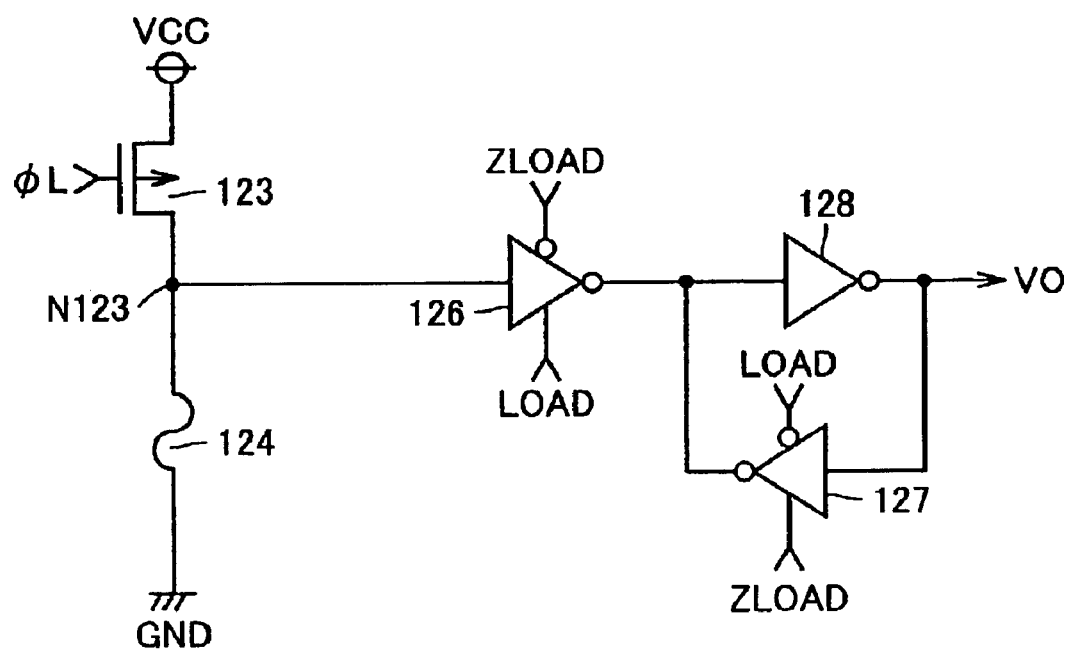
FIG. 31 is a circuit diagram for describing the operation of the fuse circuit shown in FIG. 29.

FIG. 31 is a circuit diagram showing only sections related to loading of fuse information in signal generation circuit 115 shown in FIG. 29. In loading fuse information, the level of blow signal φBL is fixed to "L" level to make P-channel MOS transistor 122 nonconductive, and the level of signal φSE is fixed to "H" level to make N-channel MOS transistor 125 conductive. In the circuits shown in FIG. 31, therefore, high voltage application terminal 120, P-channel MOS transistor 122 and N-channel MOS transistor 135 are eliminated.

Figure 32:
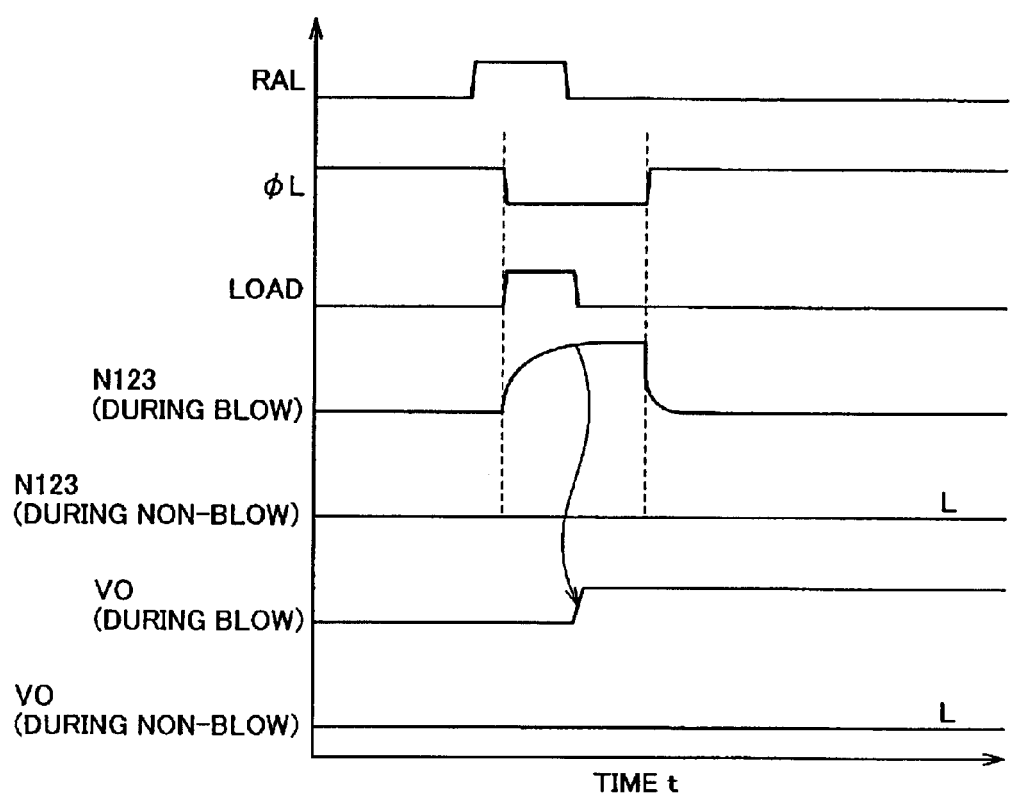
FIG. 32 is a time chart showing the operation of the fuse circuit shown in FIG. 31.

FIG. 32 is a time chart showing the operations of the circuits shown in FIG. 31. Referring to FIG. 32, if the level of signal RAL is raised from "L" level to "H" level at certain time, the level of signal φL is caused to fall to "L" level to make P-channel MOS transistor 123 conductive and the level of signal LOAD is raised to "H" level to activate clocked inverter 126.

If fuse 124 is blown, node 123 is charged to raise the level thereof to "H" level and the level of an output signal VO to "H" level. If fuse 124 is not blown, the level of node N123 remains "L" level and that of signal VO remains "L" level. If the level of signal RAL is caused to fall from "H" level to "L" level, that of signal LOAD is caused to fall from "H" level to "L" level, thereby deactivating clocked inverter 126, activating clocked inverter 127 and latching the level of a signal V4 by inverters 127 and 128.

Figure 33:
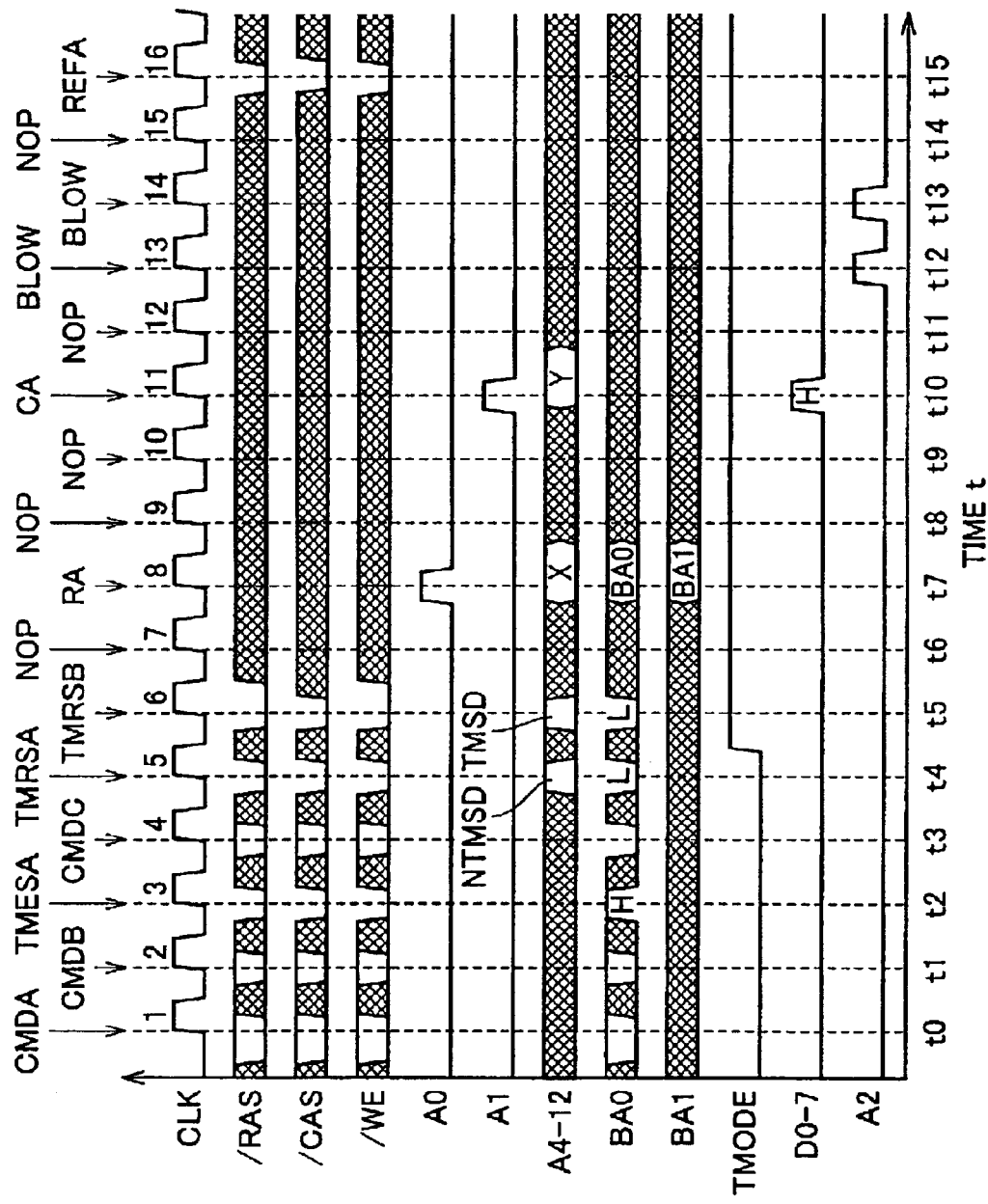
FIG. 33 is a time chart showing the operation of registered DIMM according to the fourth embodiment.

FIG. 33 is a time chart showing a method for selecting a desired SDRAM (e.g., SDRAM 100) from among eight SDRAM 100 to 107 included in DIMM and for programming a defective address in selected SDRAM 100 by the test mode setting method without using high voltage SVIH.

In FIG. 33, first command CMDA, second command CMDB, test mode entry set command TMESA, third command CMDC and test mode register set command TMRSA are applied synchronously with the first to fifth rising edges of clock signal CLK, respectively, and the level of test mode entry signal TMODE is raised to "H" level. Next, test mode register set command TMRSB is inputted synchronously with the sixth rising edge of clock signal CLK and SDRAM 100 enters a blow mode. Each of test mode set data NTMSD and TMSD includes address signals A4 to A12.

The level of signal A0 is raised to "H" level synchronously with the eighth rising edge of clock signal CLK, and bank select signals BA0 and BA1 and row address signal X (A4 to A12) corresponding to a defective memory cell are inputted. As a result, bank select signal BA0 and BA1 and row address signal X corresponding to the defective memory cell are held by fourteen registers 120. The level of signal A1 is raised to "H" level synchronously with the eleventh rising edge of clock signal CLK, column address signal Y (A4 to A12) corresponding to the defective memory cell is inputted and data signals D0 to D7 are set at "H" level. As a result, column address signal Y corresponding to the defective memory cell is held by twelve registers 120 and SDRAM 100 corresponding to data signals D0 to D7 is selected.

Next, the level of address signal A2 is raised to "H" level synchronously with thirteenth and fourteenth rising edges of clock signal CLK to selectively blow each of a plurality of fuses 124, and inputted bank select signals BA0 and BA1 and address signals X and Y are programmed. A blow signal φBL is generated based on signal A2. If auto-refresh command REFA is inputted synchronously with the rising edge of clock signal CLK, each register 120 is reset.

Figure 34:
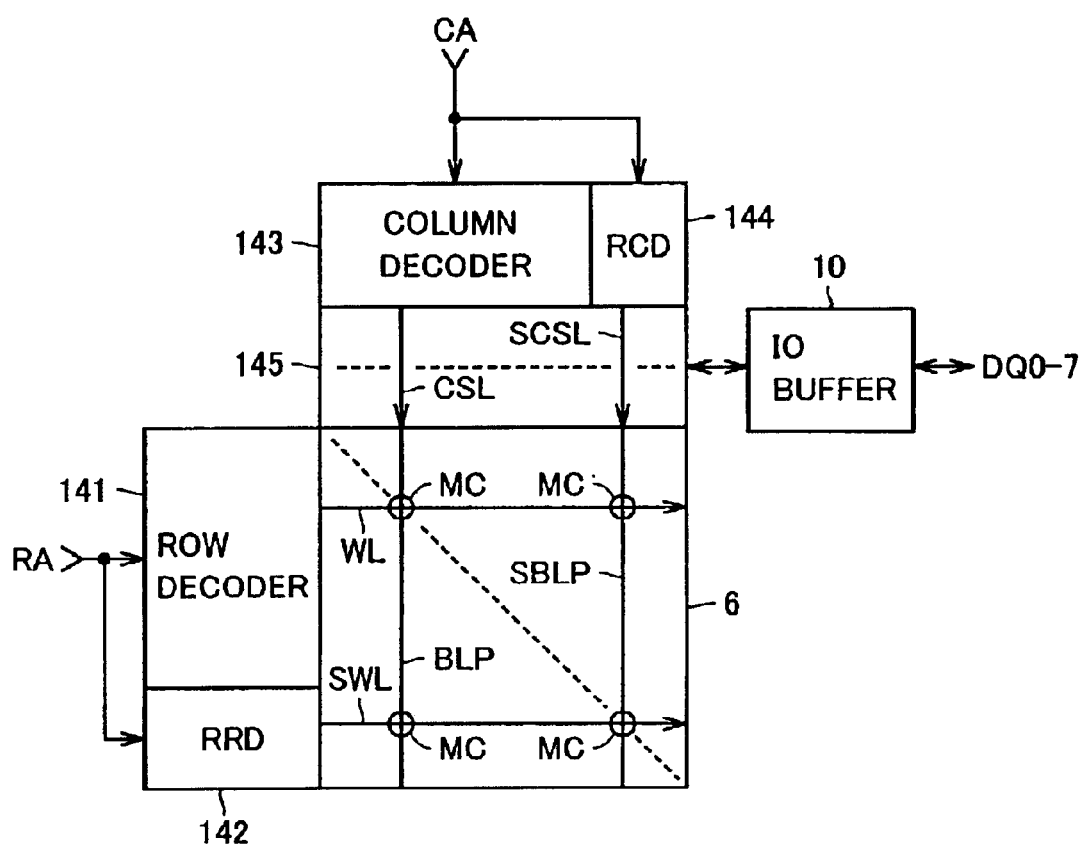
FIG. 34 is a block diagram showing the important parts of DDR SDRAM included in registered DIMM according to the fourth embodiment.

FIG. 34 is a block diagram showing the important parts of this SDRAM 100. In FIG. 34, SDRAM 100 includes a memory array 6, IO buffer 10, a row decoder 141, a redundant row decoder (RRD) 142, a column decoder 143, a redundant column decoder (RCD) 144 and a sense amplifier+input/output control circuit 145.

Memory array 6 includes a plurality of memory cells MC which are arranged in a plurality of rows and a plurality of columns, a plurality of word lines WL which are provided to correspond to the respective plural rows, and a plurality of bit line pairs BLP which are provided to correspond to respective plural columns. At least one word line WL among plural word lines WL is employed as a spare word line SWL. A plurality of bit line pairs BLP are grouped for eight pairs, respectively, in advance. At least one bit line pair group among a plurality of bit line pair groups is employed as a spare bit line pair group.

Row decoder 141 selects one word line WL from among a plurality of word lines WL in accordance with a row address signal RA, raises the level of selected word line WL to selected level of "H" level and thereby activates a plurality of memory cells MC corresponding to selected word line WL.

Figure 35:
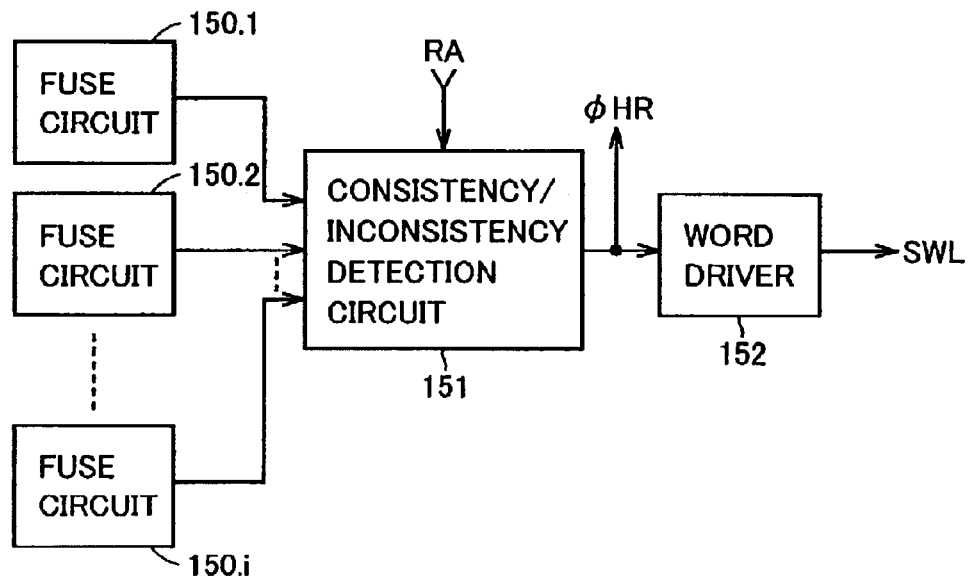
FIG. 35 is a block diagram showing the important parts of a redundant row decoder shown in FIG. 34.

As shown in FIG. 35, redundant row decoder 142 includes i (where i is a natural number) fuse circuits 150.1 to 150.i provided to correspond to respective spare word lines SWL, a consistency/inconsistency detection circuit 151 and a word driver 152. Fuse circuits 150.1 to 150.i apply a defective row address signal programmed in advance to consistency/ inconsistency detection circuit 151. Consistency/ inconsistency detection circuit 151 raises the level of a hit signal φHR to "H" level in accordance with the consistency of row address signal RA which is applied from the outside of SDRAM with the defective address signal from fuse circuits 151.1 to 151.i. If the level of hit signal φHR is raised to "H" level, then row decoder 141 is deactivated, the levels of all word lines WL are fixed to unselected level of "L" level and word line driver 152 raises the level of spare word line SWL to selected level of "H" level. As a result, the defective memory cell row is replaced by a spare memory cell row.

Column decoder 143 selects one column select line CSL from among a plurality of column select lines CSL in accordance with a column address signal CA, and raises the level of selected column select line CSL to selected level of "H" level. Column select line CSL is provided to correspond to each bit line pair group and spare column select line SCSL is provided to correspond to each spare bit line pair group.

Figure 36:
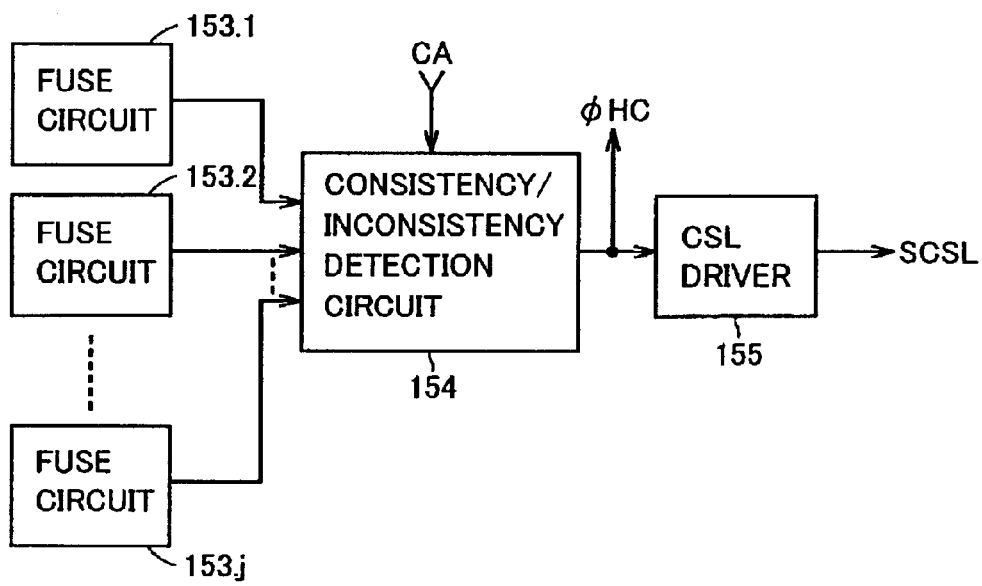
FIG. 36 is a block diagram showing the important parts of a redundant column decoder shown in FIG. 34.

As shown in FIG. 36, redundant column decoder 144 includes j (where j is a natural number) fuse circuits 153.1 to 153.j which are provided to correspond to respective spare column select lines SCSL, a consistency/inconsistency detection circuit 154 and a CSL driver 155. Fuse circuits 153.1 to 153.j apply a defective address signal programmed in advance to consistency/inconsistency detection circuit 154. If the level of a hit signal φHC is raised to "H" level in accordance with the consistency of column address signal CA applied from the outside of SSDRAM with the defective column address signal from fuse circuits 153.1 to 153.j, then column decoder 143 is deactivated to fix the levels of all column select lines CSL to unselected level of "L" level and to fix the level of spare column select line SCSL to selected level of "H" level.

Referring back to FIG. 34, sense amplifier+input/output control circuit 145 amplifies the potential difference generated between bit line pairs BLP to power supply voltage VCC and connects eight bit line pairs BLP or SBLP corresponding to column select line CSL or SCSL set at selected level of "H" level to IO buffer 10. IO buffer 10 writes write data signals D0 to D7 applied from the outside to eight memory cells MC activated by row decoder 141 or 142 through eight bit line pairs BLP or SBLP selected by column decoder 143 or 144. Further, IO buffer 10 outputs eight read data Q0 to Q7 read from eight memory cells MC activated by row decoder 141 or 142 and selected by column decoder 143 or 144 through eight bit line pairs BLP or SBLP.

In this fourth embodiment, the desired SDRAM (e.g., SDRAM 100) can be selected from among a plurality of SDRAM 1 to SDRAM 107 included in registered DIMM and the to-be-replaced defective address can be programmed only in selected SDRAM 100.

Fifth Embodiment

Figure 37:
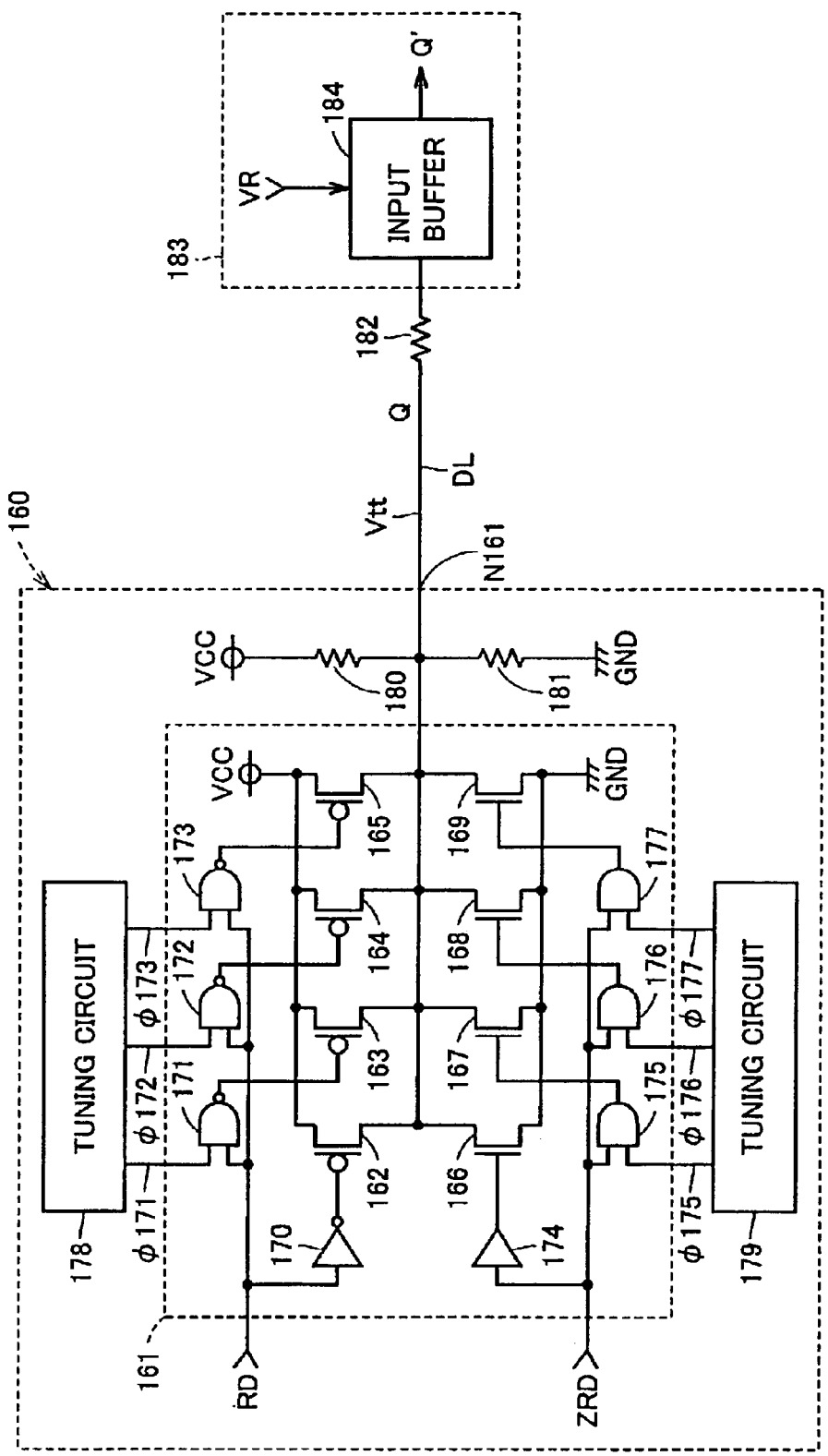
FIG. 37 is a circuit block diagram showing the important parts of a memory system according to the fifth embodiment of the present invention.
Figure 38:
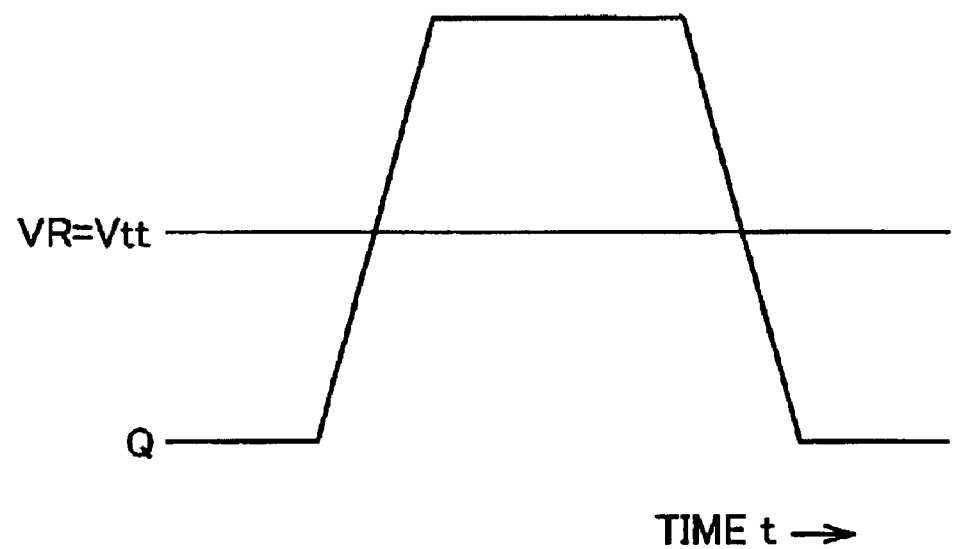
FIG. 38 is a time chart for describing the operation of the memory system shown in FIG. 37.

FIG. 37 is a circuit block diagram showing the configuration of a memory system according to the fifth embodiment of the present invention. As shown in FIG. 37, in this memory system, the output node N161 of an SDRAM 160 included in registered DIMM is connected to the input buffer 184 of a memory controller 183 through a data line DL and a resistance element 182. This memory system adopts an SSTL interface which is a high rate interface.

As shown in FIG. 37, in SSTL interface, a terminated potential Vtt is applied to data line DL and signal levels VIH and VIL are specified to VR±0.2V relative to a reference voltage VR=Vtt=1.25V. In this SSTL interface, the pull-up capability and pull-down capability of the output buffer 161 of SDRAM 160 can be respectively tuned. This is intended to suppress ringing by matching these capabilities with the impedance of a motherboard. This is also intended to make a rate for raising the potential of data line DL from VIL to VIH consistent with a rate for lowering the potential of data line DL from VIH to VIL.

That is, SDRAM 160 includes output buffer 161, tuning circuits 178 and 179, and resistance elements 180 and 181 for terminated ends. Output buffer 161 includes P-channel MOS transistors 162 to 165, N-channel MOS transistors 166 to 169, an inverter 170, NAND gates 171 to 173, a buffer 174 and AND gates 175 to 177. P-channel MOS transistors 162 to 165 are connected in parallel between a power supply potential VCC line and output node N161, and N-channel MOS transistors 166 to 169 are connected in parallel between output node N161 and a ground potential GND line.

An internal read data signal RD is inputted into the gate of P-channel MOS transistor 162 through inverter 170 and also inputted into one of the input nodes of each of NAND gates 171 to 173. Output signals φ171 to φ173 of tuning circuit 178 are inputted into the other input nodes of NAND gates 171 to 173, respectively. The output signals of NAND gates 171 to 173 are inputted into the gates of P-channel MOS transistors 163 to 165, respectively. A complementary signal ZRD to internal read data signal RD is inputted into the gate of N-channel MOS transistor 166 through buffer 174 and also inputted into one of the input nodes of each of AND gates 175 to 177. Output signals φ175 to φ177 of tuning circuit 179 are inputted into the other input nodes of AND gates 175 to 177, respectively. The output signals of AND gates 175 to 177 are inputted into the gates of N-channel MOS transistors 167 to 169, respectively.

Tuning circuit 178 includes three fuse circuits. Each fuse circuit is the same in configuration as that shown in FIG. 29 except that test mode signal TM0 is replaced by a test mode signal TM1 for tuning output buffer 161. The fuse of each fuse circuit is blown by the method described in the fourth embodiment. The three fuse circuits output signals φ171 to φ173, respectively. If three signals φ171 to φ173 are all set at "H" level, NAND gates 171 to 173 operate as inverters for signal RD, respectively. If the level of signal RD is raised to "H" level, four P-channel MOS transistors 162 to 165 become conductive to maximize the pull-up capability.

If one signal (e.g., φ171) among signals φ171 to φ173 is set at "H" level and the other signals φ172 and φ173 in this case) are set at "L" level, then NAND gate 171 operates as an inverter and the levels of the output signals of NAND gates 172 and 173 are fixed to "H" level. If the level of signal RD is raised to "H" level, two P-channel MOS transistors 162 and 163 become conductive and the pull-up capability becomes intermediate level. If three signals φ171 to φ173 are all set at "L" level, the levels of the output signals of NAND gates 171 to 173 are all fixed to "H" level. If the level of signal RD is raised to "H" level, only one P-channel MOS transistor 162 becomes conductive to minimize the pull-up capability.

Tuning circuit 179, similar to tuning circuit 178, includes three fuse circuits. The fuse of each fuse circuit is blown by the method described in the fourth embodiment. The three fuse circuits output signals φ175 to φ177, respectively. If three signals φ175 to φ177 are all set at "H" level, NAND gates 175 to 177 operate as inverters for signal ZRD, respectively. If the level of signal ZRD is raised to "H" level, four N-channel MOS transistors 166 to 169 become conductive to maximize the pull-up capability.

If one signal (e.g., φ175) among signals φ175 to φ177 is set at "H" level and the other signals (φ176 and φ177 in this case) are set at "L" level, then AND gate 175 operates as a buffer and the levels of the output signals of AND gates 176 and 177 are fixed to "L" level. If the level of signal ZRD is raised to "H" level, two N-channel MOS transistors 166 and 167 become conductive and the pull-down capability becomes intermediate level. If three signals φ175 to φ177 are all set at "L" level, the levels of the output signals of AND gates 175 to 177 are all fixed to "L" level. If the level of signal ZRD is raised to "H" level, only one N-channel MOS transistor 166 becomes conductive to minimize the pull-down capability. Whether each of signals φ171 to φ173 and φ175 to φ177 is to be set at "H" or "L" level is determined by a separate test in advance.

Resistance element 180 is connected between the power supply potential VCC line and output node N161 and resistance element 181 is connected between output node N161 and the ground potential GND line. Resistance elements 180 and 181 are equal in resistance value. If MOS transistors 162 to 169 of output buffer 161 are all nonconductive, potential Vtt of node N161 becomes VCC/2. Input buffer 184 of memory controller 183 compares the potential of data line DL with reference potential VR and generates a signal Q' at level according to the comparison result.

In this fifth embodiment, the desired SDRAM can be selected from among a plurality of SDRAM included in registered DIMM and the pull-up capability and pull-down capability of output buffer 161 can be appropriately set only for selected SDRAM.

Figure 39:
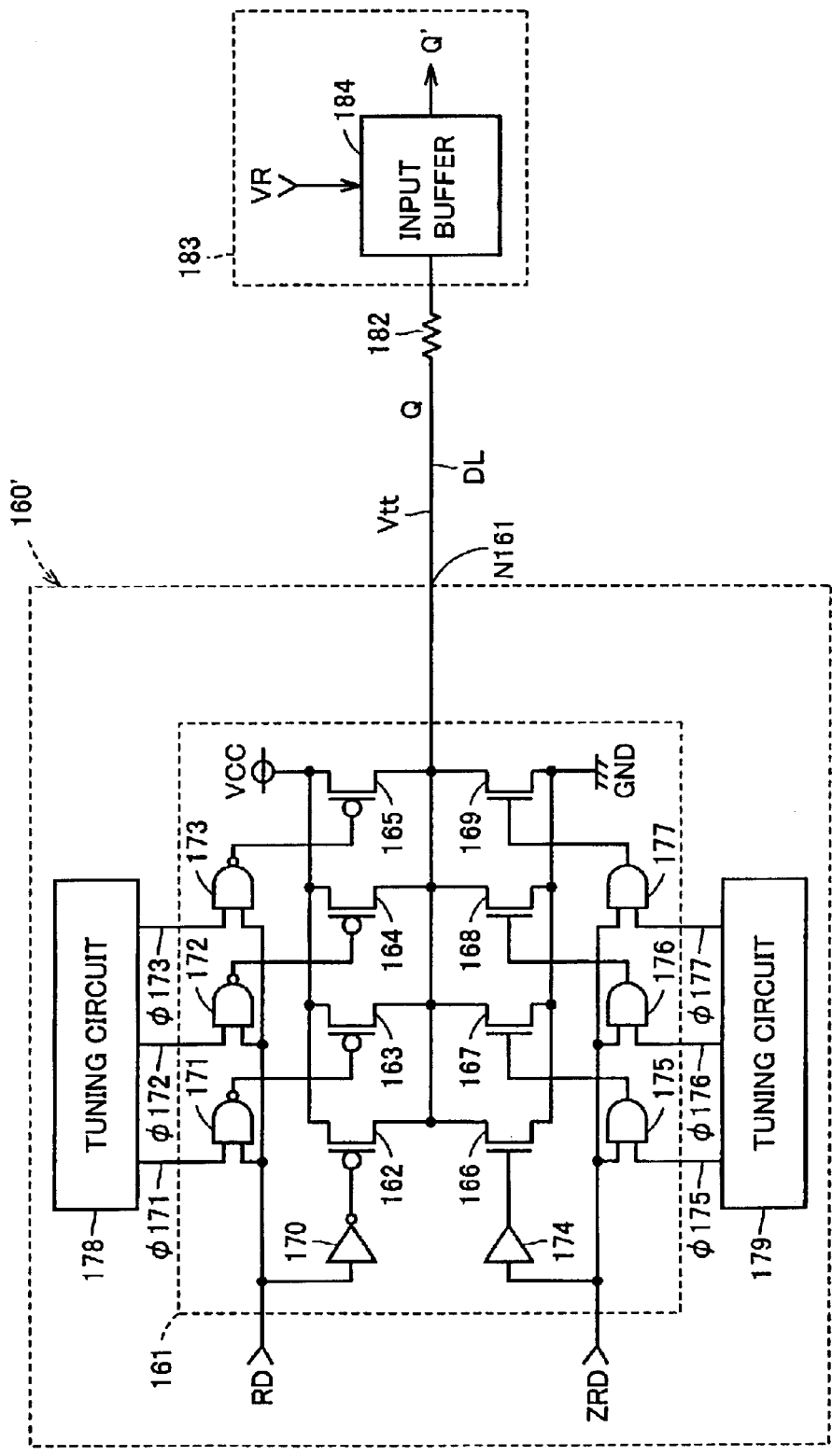
FIG. 39 is a circuit block diagram showing the modification of the fifth embodiment.

As shown in FIG. 39, terminated end resistance elements 180 and 181 shown in FIG. 37 may be eliminated. In this case, a chip area can be reduced by as much as resistance elements 180 and 181.

Figure 40:
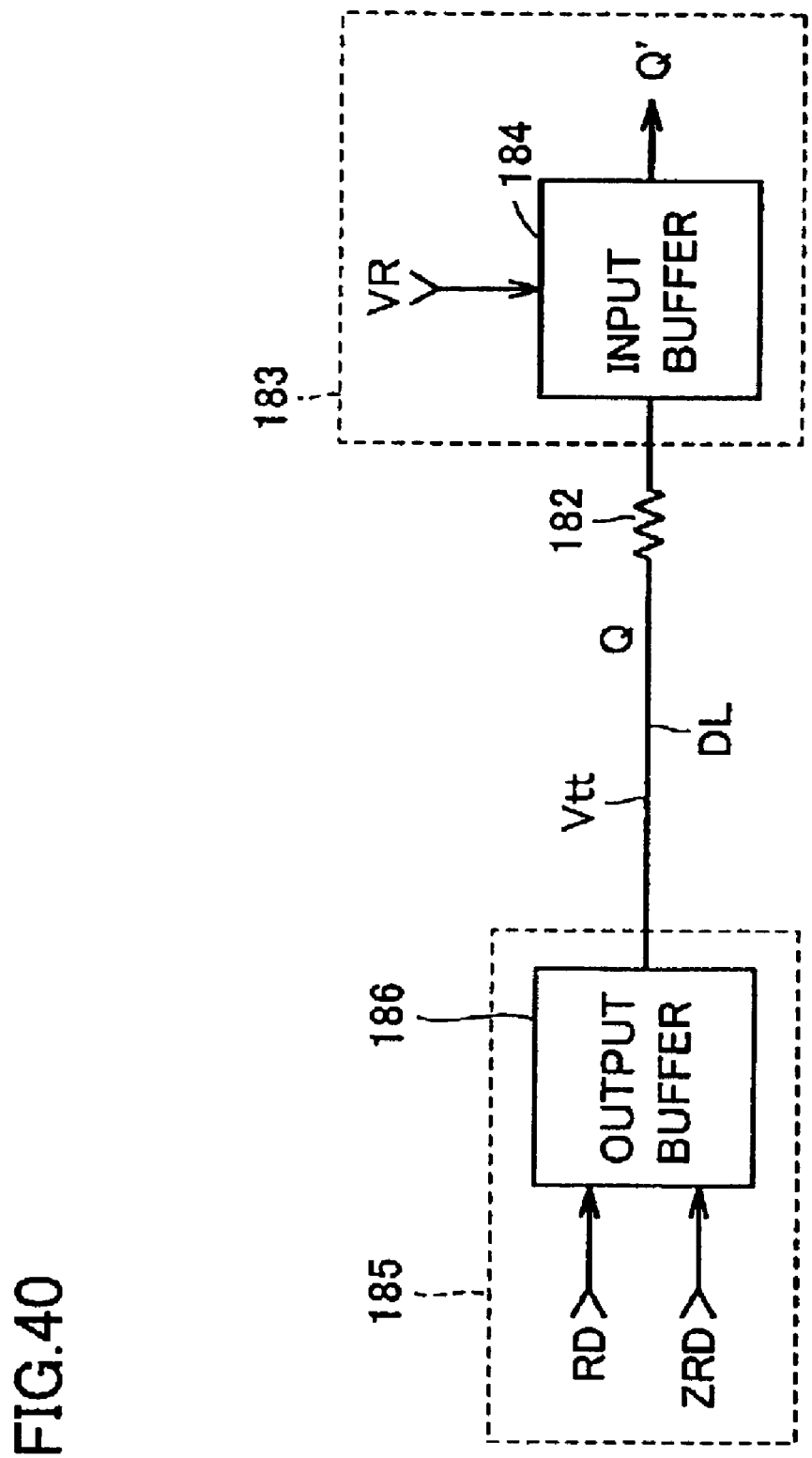
FIG. 40 is a circuit block diagram for describing the features of the fifth embodiment.

As shown in FIG. 40, conventional SDRAM 185 is not provided with tuning circuits 178 and 179 and terminated end resistance elements 180 and 181 and the pull-up capability and pull-down capability of output buffer 186 are, quite obviously, fixed.

Sixth Embodiment

Figure 41:
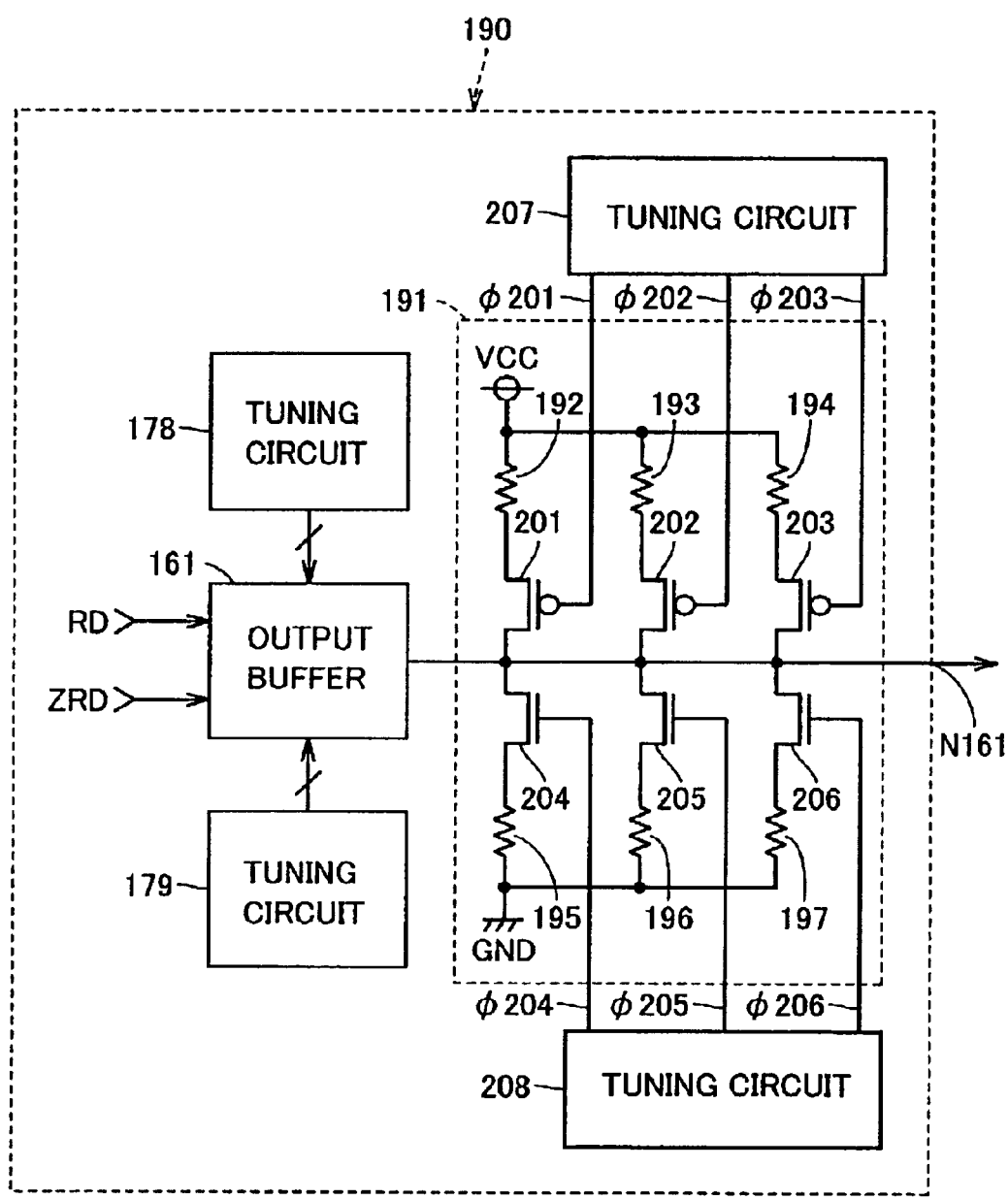
FIG. 41 is a circuit block diagram showing the important parts of DDR SDRAM included in registered DIMM according to the sixth embodiment of the present invention.

FIG. 41 is a circuit block diagram showing the configuration of a DDR SDRAM 190 included in registered DIMM according to the sixth embodiment of the present invention. In FIG. 41, this DDR SDRAM 190 is constituted so that terminated end resistance elements 180 and 181 of SDRAM 160 shown in FIG. 37 are replaced by a variable resistance circuit 191 and tuning circuits 207 and 208 are added. Variable resistance circuit 191 includes resistance elements 192 to 197, P-channel MOS transistors 201 to 203 and N-channel MOS transistors 204 to 206. One of the terminals of each of resistance element 192 to 194 is connected to a power supply VCC line and one of the terminals of each of resistance elements 195 to 197 is connected to a ground potential GND line. Resistance elements 192 to 194 differ in resistance value and resistance elements 195 to 197 differ in resistance value. P-channel MOS transistors 201 to 203 are connected between the other terminals of resistance elements 192 to 194 and output node N161, respectively and the gates of P-channel MOS transistors 201 to 203 receive output signals φ201 to φ203 of tuning circuit 207, respectively. N-channel MOS transistors 204 to 206 are connected between the other terminals of resistance elements 195 to 197 and output node N161, respectively and the gates of N-channel MOS transistors 204 to 206 receive output signals φ204 to φ206 of tuning circuit 208, respectively.

Tuning circuit 207 includes three fuse circuits. Each fuse circuit is the same in configuration to fuse circuit 115 shown in FIG. 29 except that test mode signal TM0 is replaced by a test mode signal TM2 for tuning the resistance value of variable resistance circuit 191. The fuse of each fuse circuit is blown by the method described in the fourth embodiment. The three fuse circuits output signals φ201 to φ203, respectively. Only one signal (e.g., φ201) selected from among three signals φ201 to φ203 by a test in advance is set at "H" level and resistance element 193 is connected between the power supply VCC line and output node N161.

Tuning circuit 208, similar to tuning circuit 207, includes three fuse circuits. The fuse of each fuse circuit is blown by the method described in the fourth embodiment. The three fuse circuits output signals φ204 to φ206, respectively. Only one signal (e.g., φ205) selected from among three signals φ204 to φ206 by a test in advance is set at "H" level and resistance element 196 is connected between the ground potential GND line and output node N161.

In this sixth embodiment, the desired SDRAM can be selected from among a plurality of SDRAM included in registered DIMM and the resistance value of terminated end variable resistance circuit 191 can be appropriately set only for the selected SDRAM.

Figure 42:
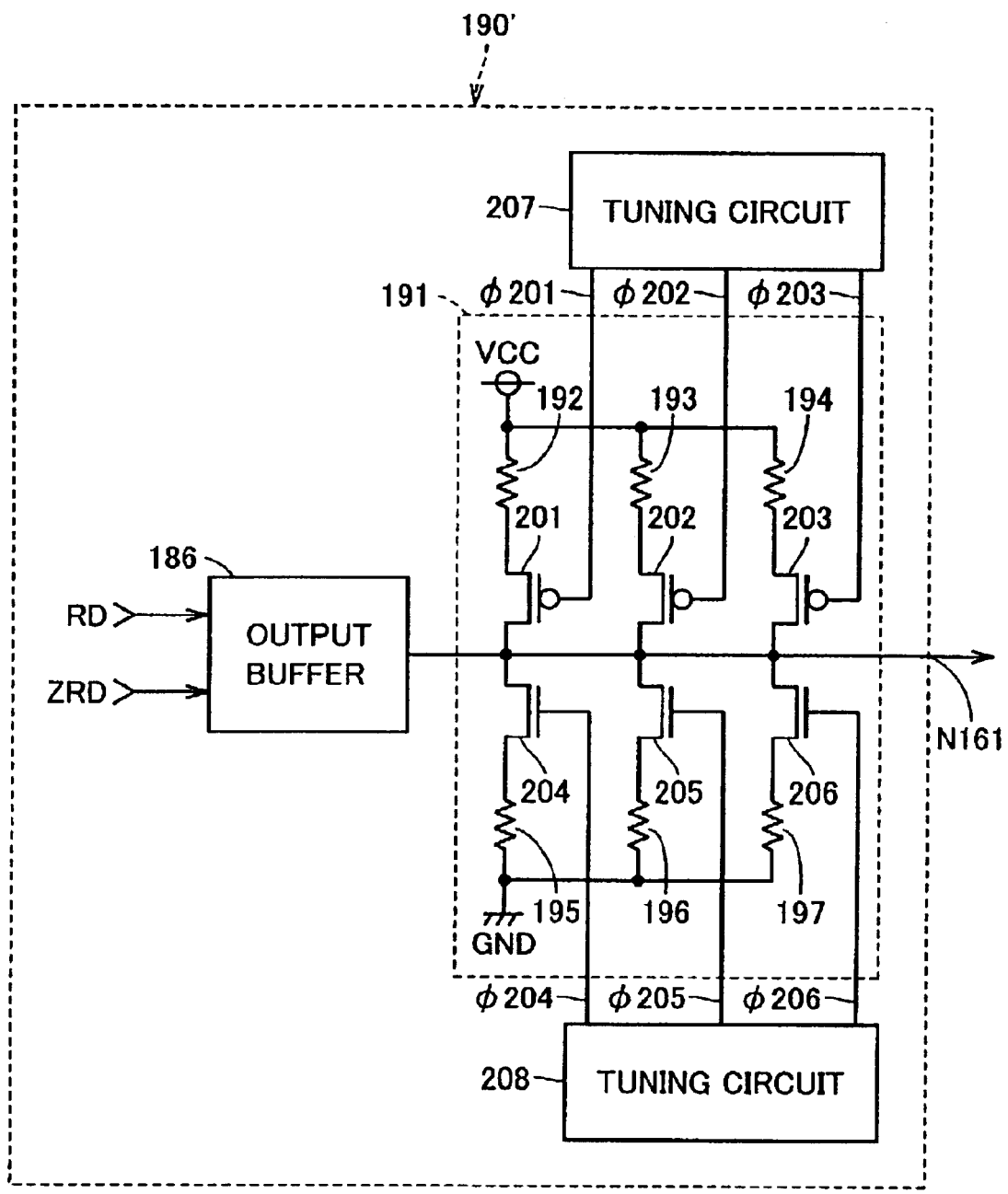
FIG. 42 is a circuit block diagram showing the modification of the sixth embodiment.
Figure 43:
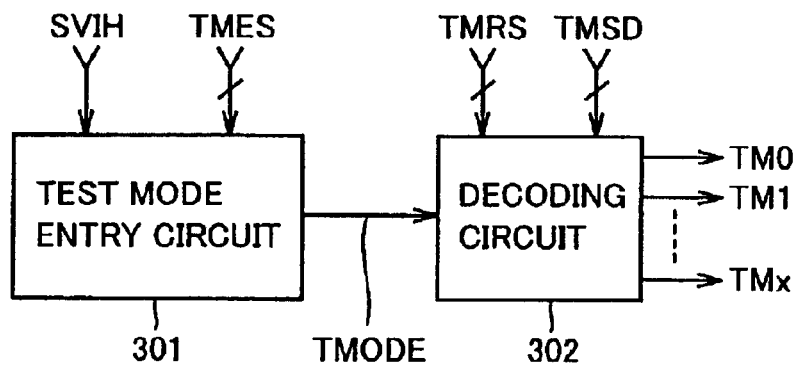
FIG. 43 is a block diagram showing the important parts of a conventional DDR SDRAM.
Figure 44:
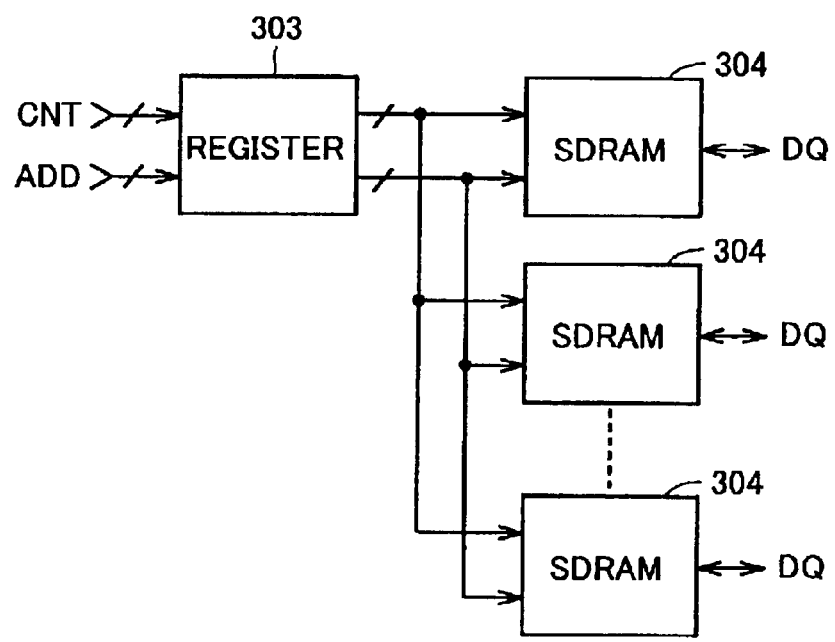
FIG. 44 is a block diagram for describing the disadvantages of DDR SDRAM shown in FIG. 43.

As shown in FIG. 42, tuning circuits 178 and 179 may be eliminated from SDRAM 190 shown in FIG. 40 and output buffer 161 may be replaced by output buffer 186, shown in FIG. 40, having fixed pull-up and pull-down capabilities. In this case, a chip area can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for taking in a plurality of external signals synchronization with a clock signal, comprising:

a decoder configured for outputting one command signal among a plurality of command signals based on a combination of logic levels of the plurality of external signals taken in; and a first signal generation circuit configured for outputting a test mode entry signal for allowing the semiconductor memory device to enter a test mode in accordance with the output of said plurality of command signals from said decoder in a predetermined order, wherein said first signal generation circuit outputs said test mode entry signal in accordance with the output of said plurality of command signals in a predetermined order at predetermined timing.

2. The semiconductor memory device according to claim 1, wherein said predetermined order is an order different from an order for outputting said plurality of command signals in a normal operation.

3. The semiconductor memory device according to claim 1, further comprising a second signal generation circuit configured to be activated in accordance with the output of said test mode entry signal from said first signal generation circuit, and configured for outputting one test mode signal among a plurality of test mode signals for executing different test modes based on the combination of the logic levels of the incorporated plurality of external signals.

4. The semiconductor memory device according to claim 3, further comprising a third signal generation circuit configured for outputting an activation signal when an external data signal included in the plurality of external signals taken in has predetermined logic level, wherein the test mode can be executed in said semiconductor memory device only when the test mode signal is outputted from said second signal generation circuit and the activation signal is outputted from said third signal generation circuit.

5. The semiconductor memory device according to claim 1, further comprising:

a plurality of memory cells configured to be allocated unique address signals, respectively;

a spare memory cell configured for replacing a defective memory cell among said plurality of memory cells;

a storage circuit configured for storing the address signal of said defective memory cell;

a write circuit configured to be activated in the test mode, and configured for writing the address signal of said defective memory cell to said storage circuit;

a select circuit configured for determining whether the external address signal included in said plurality of external signals coincide with the address signal stored in said storage circuit, selecting said spare memory cell when the external address signal coincide with the address signal stored in said storage circuit, and selecting the memory cell corresponding to the external address signal when the external address signal does not coincide with the address signal stored in said storage circuit; and a write and read circuit configured for writing and reading a data signal of the memory cell or spare memory cell selected by said select circuit.

6. The semiconductor memory device according to claim 1, further comprising:

an output buffer having a current driving capability which is variable, and configured for outputting an external signal in response to an internal signal; and a tuning circuit configured to be activated in the test mode, and configured for tuning the current driving capability of said output buffer in accordance with said plurality of external signals.

7. The semiconductor memory device according to claim 1, further comprising:

a variable resistance circuit configured for terminating a signal terminal; and a tuning circuit configured to be activated in the test mode, and configured for tuning a resistance value of said variable resistance circuit in accordance with the plurality of external signals.

8. A memory system comprising a plurality of semiconductor memory devices according to claim 1, wherein signals other than external data signal among said plurality of external signals is applied to said plurality of semiconductor memory devices in common, and the external data signal is individually applied to said plurality of semiconductor memory devices, respectively.

9. The memory system according to claim 8, further comprising a register configured for taking in the signals other than the external data signal among said plurality of external signals and outputting the signals taken in synchronization with said clock signal, wherein each of said plurality of semiconductor memory devices takes in an output signal of said register synchronization with said clock signal.

* * * * *